United States Patent
Masuda et al.

(10) Patent No.: US 10,682,669 B2
(45) Date of Patent: Jun. 16, 2020

(54) METHOD FOR MANUFACTURING LAMINATE

(71) Applicants: Shin-Etsu Chemical Co., Ltd., Tokyo (JP); TEIJIN LIMITED, Osaka (JP)

(72) Inventors: Kohei Masuda, Gunma (JP); Masaki Tanaka, Tokyo (JP); Takashi Yoda, Osaka (JP); Tatsuya Ekinaka, Osaka (JP)

(73) Assignees: SHIN-ETSU CHEMICAL CO., LTD., Tokyo (JP); TEIJIN LIMITED, Osaka (JP)

( * ) Notice: Subject to any disclaimer, the term of this patent is extended or adjusted under 35 U.S.C. 154(b) by 170 days.

(21) Appl. No.: 16/066,167

(22) PCT Filed: Dec. 27, 2016

(86) PCT No.: PCT/JP2016/088985
§ 371 (c)(1),
(2) Date: Jun. 26, 2018

(87) PCT Pub. No.: WO2017/115819
PCT Pub. Date: Jul. 6, 2017

(65) Prior Publication Data
US 2019/0015868 A1 Jan. 17, 2019

(30) Foreign Application Priority Data
Dec. 28, 2015 (JP) ................... 2015-257481

(51) Int. Cl.
*B05D 1/38* (2006.01)
*B05D 3/04* (2006.01)
(Continued)

(52) U.S. Cl.
CPC ................. *B05D 1/38* (2013.01); *B05D 1/62* (2013.01); *B05D 3/0493* (2013.01); *B05D 3/141* (2013.01);
(Continued)

(58) Field of Classification Search
CPC .......... B05D 1/38; B05D 1/62; B05D 3/0493; B05D 3/141; B05D 7/24
See application file for complete search history.

(56) References Cited

U.S. PATENT DOCUMENTS

| 3,986,997 A | 10/1976 | Clark |
| 4,051,161 A | 9/1977 | Proskow |

(Continued)

FOREIGN PATENT DOCUMENTS

| JP | 51-2736 | 1/1976 |
| JP | 53-130732 | 11/1978 |

(Continued)

OTHER PUBLICATIONS

International Search Report dated Apr. 4, 2017 in International (PCT) Application No. PCT/JP2016/088985.

*Primary Examiner* — Dah-Wei D. Yuan
*Assistant Examiner* — Kristen A Dagenais-Englehart
(74) *Attorney, Agent, or Firm* — Wenderoth, Lind & Ponack, L.L.P.

(57) ABSTRACT

The present invention provides a method for manufacturing a laminate that exhibits visible light transparency and ultraviolet light shielding properties while maintaining an extremely high degree of scratch resistance, and that has all the necessary weather resistance and durability properties for withstanding long-term outdoor exposure. This method for manufacturing a laminate having the abovementioned properties includes: (1) using active energy rays to cure, on an organic resin substrate, an acrylic silicone resin compo- (Continued)

sition having an inorganic component percentage X of 0.2 to 0.8 to form an intermediate layer, (2) dry-etching the surface of the intermediate layer obtained at step (1) using a non-oxidizing gas plasma of a plasma irradiation amount Y correlated with the inorganic component percentage X; and (3) plasma-polymerizing an organosilicon compound to form a hard coat layer on the surface of the intermediate layer obtained at step (2).

12 Claims, 5 Drawing Sheets

(51) Int. Cl.
| | |
|---|---|
| B05D 7/24 | (2006.01) |
| B32B 27/00 | (2006.01) |
| B32B 27/18 | (2006.01) |
| B32B 27/30 | (2006.01) |
| C08J 7/04 | (2020.01) |
| C08J 7/12 | (2006.01) |
| B05D 1/00 | (2006.01) |
| B05D 3/14 | (2006.01) |
| C23C 16/30 | (2006.01) |
| C08K 3/22 | (2006.01) |
| B05D 1/18 | (2006.01) |
| B05D 5/06 | (2006.01) |
| B05D 7/00 | (2006.01) |
| B32B 7/12 | (2006.01) |
| B32B 27/24 | (2006.01) |
| B32B 27/36 | (2006.01) |

(52) U.S. Cl.
CPC ............ *B05D 7/24* (2013.01); *B32B 27/00* (2013.01); *B32B 27/18* (2013.01); *B32B 27/30* (2013.01); *C08J 7/042* (2013.01); *C08J 7/123* (2013.01); *C23C 16/30* (2013.01); *B05D 1/18* (2013.01); *B05D 5/06* (2013.01); *B05D 7/546* (2013.01); *B05D 2201/02* (2013.01); *B05D 2252/00* (2013.01); *B05D 2252/10* (2013.01); *B05D 2518/10* (2013.01); *B32B 7/12* (2013.01); *B32B 27/24* (2013.01); *B32B 27/304* (2013.01); *B32B 27/308* (2013.01); *B32B 27/36* (2013.01); *C08J 2433/14* (2013.01); *C08J 2443/04* (2013.01); *C08K 2003/2241* (2013.01)

(56) References Cited

U.S. PATENT DOCUMENTS

| | | | |
|---|---|---|---|
| 4,159,206 A | | 6/1979 | Armbruster et al. |
| 4,390,660 A | | 6/1983 | Ashby |
| 4,555,559 A | | 11/1985 | Kimura et al. |
| 5,191,045 A | | 3/1993 | Funaki et al. |
| 5,391,795 A | | 2/1995 | Pickett |
| 6,129,980 A | * | 10/2000 | Tsukada .............. G02B 1/111 |
| | | | 313/479 |
| 2001/0036986 A1 | | 11/2001 | Matsumura et al. |
| 2003/0134951 A1 | * | 7/2003 | Yamaya ............. C09D 183/04 |
| | | | 524/265 |
| 2006/0078717 A1 | * | 4/2006 | Yamaya ............. C08G 77/50 |
| | | | 428/212 |
| 2012/0263933 A1 | | 10/2012 | Higuchi et al. |
| 2016/0090511 A1 | | 3/2016 | Masuda et al. |

FOREIGN PATENT DOCUMENTS

| | | |
|---|---|---|
| JP | 61-54800 | 11/1986 |
| JP | 63-168470 | 7/1988 |
| JP | 3-14862 | 2/1991 |
| JP | 3-62177 | 9/1991 |
| JP | 3-217434 | 9/1991 |
| JP | 4-106161 | 4/1992 |
| JP | 4-120181 | 4/1992 |
| JP | 7-278525 | 10/1995 |
| JP | 8-139071 | 5/1996 |
| JP | 2001-47574 | 2/2001 |
| JP | 2001-214122 | 8/2001 |
| JP | 2012-224077 | 11/2012 |
| JP | 2013-35274 | 2/2013 |
| WO | 2014/196386 | 12/2014 |

* cited by examiner

METHOD FOR MANUFACTURING LAMINATE

FIELD

The present invention relates to a method for manufacturing a laminate. In particular, the present invention relates to a method for manufacturing a laminate that is excellent in weather resistance and scratch resistance and that will withstand long term use even in harsh use environments.

BACKGROUND

Organic resin materials are used for applications in various fields by taking advantage of characteristics thereof, such as impact resistance, light weight, and processability. Efforts are currently made to take more advantage of these properties. One such approach is to apply molded organic resins having enhanced surface hardness and abrasion resistance to the windows in various vehicles. In the glazing application, a high level of abrasion resistance and outdoor weather resistance comparable to glass are required. In the case of automobiles, for example, a high level of abrasion resistance is required in order to prevent the windshield from scratching upon wiper operation and to prevent side windows from scratching upon winding up-and-down operation. Potential service in a very high temperature and/or humidity environment must also be taken into account.

Conventionally, there are known coating compositions for forming a surface protecting coat film intended to provide high hardness and scratch resistance on the surface of an organic resin substrate made of plastic or the like. The coating compositions are made of a composition obtained by hydrolyzing or partially hydrolyzing a hydrolysable organosilane or are prepared by mixing colloidal silica into the composition.

For example, Patent Document 1 to 3 disclose coating compositions that contain organoalkoxysilane, a hydrolysate of the organoalkoxysilane and/or a partial condensate thereof, and colloidal silica, and in which the alkoxy group is converted with excess of water into silanol. However, there is a problem that these coating films obtained by the wet coatings were insufficient in hardness and inferior to glass as a target to be substituted in terms of scratch resistance.

In order to solve the problem of the insufficient scratch resistance in the coating films obtained by the wet coatings, there is also disclosed a method for providing an outermost layer of an additional hard film obtained by plasma polymerizing an organosilicon compound on the wet coating layer. It has been known that using the method enables obtaining of a laminate having scratch resistance equal to or higher than glass.

However, in order to form a coating film that can withstand sunlight and wind and rain for a long time, there is still another problem. The wet coating layer having scratch resistance described above cannot block ultraviolet light, thus causing a phenomenon in which the resin substrate, a primer layer for providing adhesion to the substrate, or an interface therebetween is deteriorated and/or discolored by ultraviolet light. Methods disclosed for preventing the phenomenon are to add an ultraviolet absorber to the primer layer and to introduce an ultraviolet-absorbing organic substituent into an organic resin forming the primer via a chemical bond. The terms "ultraviolet absorber" and "ultraviolet-absorbing organic substituent" as used herein refer to, for example, substituents such as benzophenone, benzotriazole, and triazine and organic compounds containing the substituents (see Patent Document 4 to 7).

The above-mentioned methods are those in which ultraviolet light is blocked by the primer layer containing the organic ultraviolet absorber. However, originally, the primer layer is mainly intended for improving adhesion between the underlying organic resin substrate and a silicone layer. Accordingly, when the amount of the ultraviolet absorber added is too much, problems occur, such as adhesion reduction and transparency reduction. Additionally, long-term outdoor exposure testing and accelerated weather resistance testing have shown that blocking of ultraviolet light by merely introducing the ultraviolet absorber and/or the ultraviolet-absorbing organic substituent into the primer layer is insufficient to prevent deterioration and discoloration of the organic resin substrate.

On the other hand, as a method for compensating for the disadvantages, an organic ultraviolet absorber has also conventionally been added to a silicone layer. However, simply adding such a compound to a coating composition does not improve durability of a coating film resulting from the composition. In other words, the ultraviolet absorber bleeds and flows out from the surface after long-term exposure, lacking persistence. Then, methods of using a silyl-modified organic ultraviolet absorber have also been disclosed to date that can form a chemical bond with a siloxane compound which is the main component of a coating layer (see Patent Document 8 to 1). In the methods, strong bonding of the ultraviolet absorber to the siloxane matrix has improved persistence, while the scratch resistance of the coating layer has been significantly reduced, or micro-cracks has been significantly occurred due to lack of flexibility thereof. Thus, the use of an organic ultraviolet absorber is inherently disadvantageous in that the hardness of a silicone film is reduced as the amount of the ultraviolet absorber to be added is increased in order to improve weather resistance.−+

In addition, such a wet coating system requires steps of laminating a plurality of layers, although a high level of weather resistance can be provided. Accordingly, simplification of the steps is urgently required in terms of reducing manufacturing time, increasing yield, and lowering ultimate cost.

The structure of an actual wet coating system is composed of at least three layers: an organic resin substrate, a primer layer, and a wet coating layer. The primer layer as used herein is mainly formed by an acrylic coating, and the wet coating layer is mainly formed by a silicone hard coating. In other words, the primary wet coating is applied and cured on the organic resin substrate, and then additionally, the silicone hard coating is applied and cured thereon to form a laminate.

When forming, as an outermost layer, a hard coating film obtained by plasma polymerizing an organosilicon compound in order to obtain scratch resistance equal to or higher than glass, a plasma polymerization step will be further added to the above-described steps.

Additionally, when forming a hard layer having scratch resistance equal to or higher than glass by plasma polymerizing an organosilicon compound, the condition for forming a dense silicon oxide layer causes a state in which the silicone hard coat layer is pulled by the silicon oxide layer. Then, the hard coat layer cannot follow the silicon oxide layer, whereby cracking defects occur in the hard coat layer during weather resistance testing.

To overcome such a disadvantage and to simplify the steps, a technique is disclosed for forming a hard film by directly plasma polymerizing an organosilicon compound on a primer wet coating layer or a photocurable (meth) acrylic hard coat layer (see Patent Document 12). However, it is known that an acrylic resin used in the primer wet coating layer or the photocurable hard coat layer is decomposed in a chain-reaction manner in a plasma (polymerization) environment. Thus, there has been a problem in that performing plasma polymerization in a strong plasma environment to form a dense silicon oxide layer causes decomposition of the underlying layer to reduce weather resistance.

As described above, the various attempts have been made to improve weather resistance, scratch resistance, etc., of wet and dry coating films. However, there has been no method for manufacturing a laminate whose coating film exhibits visible light transparency and ultraviolet light shielding properties while maintaining an extremely high level of scratch resistance (e.g., comparable to that of glass), and further fully satisfies weather resistance and durability enough to withstand long-term outdoor exposure.

CITATIONS LIST

Patent Document

[Patent Document 1] JPS51-2736A
[Patent Document 2] JPS53-130732A
[Patent Document 3] JPS63-168470A
[Patent Document 4] JPH04-106161A
[Patent Document 5] JPH04-120181A
[Patent Document 6] JP2001-047574A
[Patent Document 7] JP2001-214122A
[Patent Document 8] JPS61-54800B
[Patent Document 9] JPH03-14862B
[Patent Document 10] JPH03-62177B
[Patent Document 11] JPH07-278525A
[Patent Document 12] JP2013-035274A

SUMMARY

Technical Problem

The present invention provides a method for manufacturing a laminate that exhibits visible light transparency and ultraviolet-shielding properties while maintaining an extremely high level of scratch resistance (e.g., comparable to that of glass), and further fully satisfies weather resistance and durability enough to withstand long-term outdoor exposure.

Solution to Problem

Intensive and extensive studies by the present inventors have found that the above problems can be solved by a method comprising: curing a specific acrylic silicone resin composition by an active energy ray on an organic resin substrate to form an intermediate layer; dry etching a surface of the intermediate layer under specific conditions; and then plasma polymerizing an organosilicon compound to form a hard coat layer, whereby the present invention have been completed.

This is achieved by the following means:

<1> A method for manufacturing a laminate, comprising:
(1) curing an acrylic silicone resin composition by an active energy ray on an organic resin substrate to form an intermediate layer, wherein the acrylic silicone resin composition is an acrylic silicone resin composition containing, with respect to 100 parts by mass of the following Component (i), from 100 to 500 parts by mass of the following Component (ii), from 10 to 150 parts by mass of the following Component (iii), from 5 to 50 parts by mass of the following Component (iv), from 200 to 1000 parts by mass of the following Component (v), from 0 to 500 parts by mass of the following Component (vi), and from 0 to 500 parts by mass of the following Component (vii), and an inorganic component percentage X value obtained by dividing total parts by mass of the following Components (ii), (iii), (vi), and (vii) by total parts by mass of the following Components (i) to (vii) is from 0.2 to 0.8;

(2) dry etching a surface of the intermediate layer obtained in step (1) with a non-oxidizing gas plasma so as to satisfy the following Formulae 1 and 2:

$$Y > 5/3 \times (10 \times X + 13) \quad \text{Formula 1:}$$

$$Y < 275 \times X - 30, \quad \text{Formula 2:}$$

wherein Y represents a plasma irradiation dose (J/cm$^2$); then (3) plasma polymerizing an organosilicon compound on the surface of the intermediate layer obtained in step (2) to form a hard coat layer:

Component (i): a vinyl-based polymer represented by the following general formula (1):

$$\text{Poly-}[(A)_a\text{-co-}(B)_b\text{-co-}(C)_c] \quad (1)$$

wherein
'A', 'B', and 'C' each independently represent a vinyl-based monomer unit;
square brackets and -co-represent being a random copolymer;
'a', 'b', and 'c' represent a mole fraction;
'A' represents a vinyl-based monomer unit having an alkoxysilyl group, and 'a' represents a mole fraction of the monomer unit A and accounts for from 1 to 50% by mass of a total amount of the vinyl-based polymer;
'B' represents a ultraviolet-absorbing vinyl-based monomer unit, and 'b' represents a mole fraction of the monomer unit B and accounts for from 5 to 40% by mass of the total amount of the vinyl-based polymer; and
'C' represents another monomer unit copolymerizable with the vinyl-based monomer units A and B, and 'c' represents a mole fraction of the monomer unit C and accounts for [100−(content of monomer unit A)−(content of monomer unit B)]% by mass of the total amount of the vinyl-based polymer);

Component (ii): a hydrolytic condensate obtained by (co-)hydrolysis and condensation of at least one selected from alkoxysilanes represented by the following general formula (11) and partial hydrolysates thereof:

$$R^1_m R^2_n \text{Si}(OR^3)_{4-m-n} \quad (II)$$

wherein
$R^1$ and $R^2$ each independently represent a hydrogen atom or a monovalent hydrocarbon group having 1 to 20 carbon atoms which may be unsubstituted or may have a vinylic polymerizable group, the substituents optionally bonding to each other;
$R^3$ represents an alkyl group having 1 to 3 carbon atoms; and
'm' and 'n' each independently represent 0 or 1, and 'm+n' represent 0, 1, or 2;

Component (iii): core-shell type tetragonal titanium oxide solid-solution fine particles having a core of tetragonal titanium oxide fine particles containing tin and manganese in the form of solid solution and a shell of silicon oxide outside the core, wherein, as measured by a dynamic light scattering method, the core fine particles have a 50% cumulative distribution diameter of 30 nm or less on a volumetric basis, the core-shell type tetragonal titanium oxide solid-solution have a 50% cumulative distribution diameter of 50 nm or less on a volumetric basis, the solid solution content of tin expressed by a mole ratio of titanium to tin (Ti/Sn) is from 10 to 1,000, and the solid solution content of manganese expressed by a mole ratio of titanium to manganese (Ti/Mn) is 10 to 1,000;

Component (iv): a polycarbonate-based and/or polyester-based urethane-modified vinyl-based polymer, provided that Component (iv) is not Component (i);

Component (v): a vinyl-based polymerizable monomer that has no alkoxysilyl group and that does not form any polymer and/or any condensate before irradiation by the active energy ray, provided that Component (v) is not Components (i) and (ii);

Component (vi): a siloxane acrylate represented by the following general formula (IIIa):

[Chem. 1]

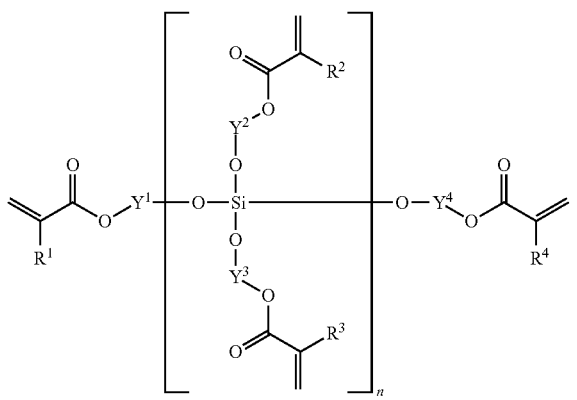

(IIIa)

wherein
R¹, R², R³, and R⁴ each independently represent a hydrogen atom or a methyl group;
Y¹, Y², Y³, and Y⁴ each independently represent an alkylene group having 1 to 10 carbon atoms; and
'n' represents an integer of from 1 to 10; and Component (vii): an inorganic oxide, provided that Component (vii) is not Component (iii).

<2> The method according to <1>, wherein Component (vi) is contained in an amount of from 20 to 500 parts by mass with respect to 100 parts by mass of Component (i).

<3> The method according to <1> or <2>, wherein the organosilicon compound is plasma polymerized by using a capacitively coupled plasma generator.

<4> The method according to any of <1> to <3>, wherein the organic resin substrate is composed of a single layer.

<5> The method according to any of <1> to <3>, wherein the organic resin substrate has a plurality of layers including a base resin and a cap layer that are co-extruded or laminated together.

<6> The method according to any of <1> to <5>, wherein the hard coat layer has a thickness of from 3.5 to 20.0 μm.

<7> The method according to any of <1> to <6>, wherein, by the dry etching at the step (2), the surface of the intermediate layer has a water contact angle of 40° or less and a surface roughness of from 0.7 to 5 nm.

<8> The method according to any of <1> to <7>, wherein the laminate has an acceptance value of 97% or higher in a tape adhesion test based on ASTM D3359, Method B and a tape adhesion test according to ASTM D870 using ion exchanged water kept at 65° C. for 3 days, and has a delta haze value of less than 2% in a Taber abrasion test at 1000 cycles based on ASTM D1044.

<9> The method according to any of <1> to <8>, wherein a composition of the hard coat layer is changed continuously from an interface with the intermediate layer to the surface of the hard coat layer in a thickness direction by continuously changing electric power to be input, an amount of an organosilicon gas to be introduced, and an amount of a carrier gas to be introduced during the plasma irradiation.

<10> The method according to any of <1> to <9>, wherein the organosilicon compound used for the plasma polymerization has an average composition represented by the following Formula (A):

$$(SiH_xO_yR_z)_n \quad \text{Formula (A):}$$

wherein
R represents a hydrocarbon group having 1 to 8 carbon atoms, an alkoxy group having 1 to 4 carbon atoms, a carboxy group having 1 to 4 carbon atoms, an amino group, a methylamino group, a dimethylamino group, or a hydroxy group;
'x' represents from 0.5 to 2;
'y' represents from 0.1 to 1;
'z' represents from 0.5 to 1.5; and
'n' represents from 1 to 6.

<11> The method according to any of <1> to <10>, wherein the acrylic silicone resin composition used for forming the intermediate layer contains an organic ultraviolet absorber and/or an organic ultraviolet stabilizer.

<12> The method according to any of <1> to <11>, wherein the organic resin substrate is a polycarbonate resin substrate.

Advantageous Effects of Invention

The present invention can provide a method for manufacturing a laminate that exhibits visible light transparency and ultraviolet light shielding properties while maintaining an extremely high level of scratch resistance (e.g., comparable to that of glass), and further fully satisfies weather resistance and durability enough to withstand long-term outdoor exposure.

BRIEF DESCRIPTION OF DRAWINGS

FIGS. 5A and 5B are diagrams showing an example of a reaction gas introducing head provided on an electrode in the capacitively coupled type PE-CVD apparatus usable to form a silicon oxide-based hard coat layer by the PE-CVD method according to the present invention, in which FIG. 5A is a horizontal cross-sectional view, and FIG. 5B depicts an example of arrangement of a plurality of gas ejection holes provided on a surface of the electrode on a side facing a substrate to be treated.

DESCRIPTION OF EMBODIMENTS

Figure 1:
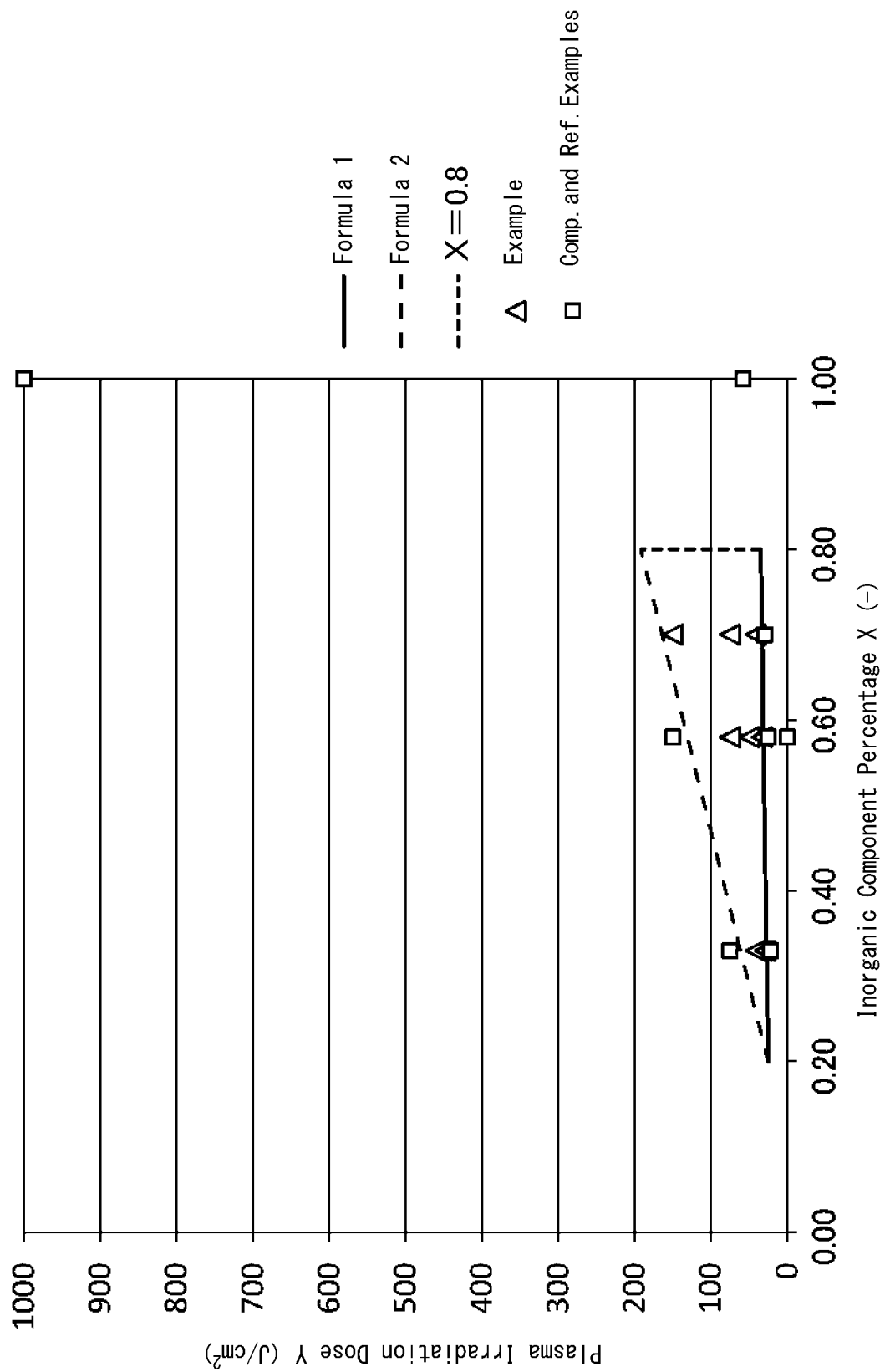
FIG. 1 is a graph showing the ranges of Formula 1 and Formula 2.

Hereinafter, a method for manufacturing a laminate according to the present invention will be specifically described in order.

<Step (1)> Intermediate Layer Formation Step
<Acrylic Silicone Resin Composition>

An acrylic silicone resin composition to be used in step (1) is an acrylic silicone resin composition that includes, with respect to 100 parts by mass of Component (i), from 100 to 500 parts by mass of Component (ii), from 10 to 150 parts by mass of Component (iii), from 5 to 50 parts by mass of Component (iv), from 200 to 1,000 parts by mass of Component (v), from 0 to 500 parts by mass of Component (vi), and from 0 to 500 parts by mass of Component (vii), in which a value obtained by dividing total parts by mass of Components (ii), (iii), (vi), and (vii) by total parts by mass of Components (i) to (vii) (the value is hereinafter referred to as "inorganic component percentage X") is from 0.2 to 0.8.

The above-mentioned Components (i) to (vii) are as follows:

Component (i)
A vinyl base polymer having the general formula (I):

wherein 'A', 'B' and 'C' each independently represent a vinyl-based monomer unit,
the square brackets and -co-represent being a random copolymer,
'a', 'b', and 'c' represent a mole fraction,
'A' represents a vinyl-based monomer unit having an alkoxysilyl group, and 'a' represents a mole fraction of the monomer unit A and accounts for from 1 to 50% by mass of a total amount of the vinyl-based polymer;
'B' represents a ultraviolet-absorbing vinyl-based monomer unit, and 'b' represents a mole fraction of the monomer unit B and accounts for from 5 to 40% by mass of the total amount of the vinyl-based polymer; and
'C' represents another monomer unit copolymerizable with the vinyl-based monomer units A and B, and 'c' represents a mole fraction of the monomer unit C and accounts for [100−(content of monomer unit A)−(content of monomer unit B)]% by mass of the total amount of the vinyl-based polymer).

Component (ii): a hydrolytic condensate obtained by co-hydrolysis and condensation of at least one selected from alkoxysilanes represented by the following general formula (II) and partial hydrolysates thereof:

$$R^1_m R^2_n Si(OR^3)_{4-m-n} \quad (II)$$

wherein
$R^1$ and $R^2$ each independently represent a hydrogen atom or a monovalent hydrocarbon group having 1 to 20 carbon atoms which may be unsubstituted or may have a vinylic polymerizable group, the substituents optionally bonding to each other;
$R^3$ represents an alkyl group having 1 to 3 carbon atoms; and
'm' and 'n' each independently represent 0 or 1, and 'm+n' represent 0, 1, or 2;

Component (iii):
Core-shell type tetragonal titanium oxide solid-solution fine particles having a core of tetragonal titanium oxide fine particles containing tin and manganese in the form of solid solution and a shell of silicon oxide outside the core, wherein, as measured by a dynamic light scattering method, the core fine particles have a 50% cumulative distribution diameter of 30 nm or less on a volumetric basis, the core-shell type tetragonal titanium oxide solid-solution have a 50% cumulative distribution diameter of 50 nm or less on a volumetric basis, the solid solution content of tin expressed by a mole ratio of titanium to tin (Ti/Sn) is from 10 to 1,000, and the solid solution content of manganese expressed by a mole ratio of titanium to manganese (Ti/Mn) is 10 to 1,000.

Component (iv)
A polycarbonate-based and/or polyester-based urethane-modified vinyl-based polymer, provided that Component (iv) is not Component (i).

Component (v):
A vinyl-based polymerizable monomer that has no alkoxysilyl group and that does not form any polymer and/or any condensate before irradiation by the active energy ray, provided that Component (v) is not Components (i) and (ii).

Component (vi):
A siloxane acrylate represented by the following general formula (IIIa):

[Chem. 2]

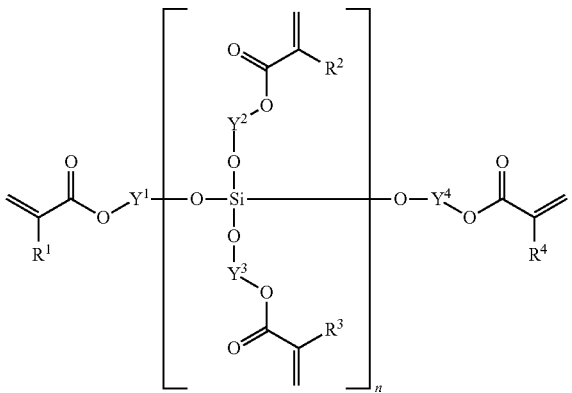

wherein
$R^1$, $R^2$, $R^3$, and $R^4$ each independently represent a hydrogen atom or a methyl group;
$Y^1$, $Y^2$, $Y^3$, and $Y^4$ each independently represent an alkylene group having 1 to 10 carbon atoms; and
'n' represents an integer of from 1 to 10).

Component (vii):
An inorganic oxide that does not correspond to Component (iii).

<Component (i)>
Component (i) above used in the present invention is a component for providing the intermediate layer with flexibility and weather resistance, as well as adhesion to the organic resin substrate and the hard coat layer. The vinyl-based monomer unit A preferably is formed by the addition polymerization of a vinyl-based monomer unit having an alkoxysilyl group.

The vinyl-based monomer unit having an alkoxysilyl group includes one or more selected from the followings, etc.:
(meth)acryloyloxyalkylene alkoxysilanes such as acryloyloxymethyl trimethoxysilane, acryioyloxymethyl dimethoxymethylsilane, acryloyloxymethyl methoxydimethylsilane, methacryloyloxymethyl trimethoxysilane, methacryloyloxymethyl dimethoxymethylsilane, methacryloyloxymethyl methoxydimethylsilane, 2-acryloyloxyethyl trimethoxysilane, 2-acryloyloxyethyl dimethoxymethylsilane, 2-acryloyloxyethyl methoxydimethylsilane, 2-methacryloyloxyethyl trimethoxysilane, 2-methacryloyloxyethyl dimethoxymethylsilane, 2-methacryloyloxyethyl methoxydimethylsilane, 3-acryloyloxypropyl trimethoxysilane, 3-acryloyloxypropyl dimethoxymethylsilane, 3-acryloyloxypropyl methoxydimethylsilane, 3-methacryloyloxypropyl trimethoxysilane, 3-methacryloyloxypropyl dimethoxymethylsilane, 3-methacryloyloxypropyl methoxydimethylsilane, 8-acryloyloxyoctyl trimethoxysilane, 8-methacryloyloxyoctyl trimethoxysilane, acryloyloxymethyl triethoxysilane, acryloyloxymethyl diethoxymethylsilane, acryloyloxymethyl ethoxydimethylsilane, methacryloyloxymethyl triethoxysilane, methacryloyloxymethyl diethoxymethylsilane, methacryloyloxymethyl ethoxydimethylsilane, 2-acryloxyoxyethyl triethoxysilane, 2-acryloyloxyethyl diethoxymethylsilane, 2-acryloxyoxyethyl ethoxydimethylsilane, 2-methacryloyloxyethyl triethoxysilane, 2-methacryloyloxyethyl diethoxymethylsilane, 2-methacryloyloxyethyl ethoxydimethylsilane, 3-acryloyloxypropyl triethoxysilane, 3-acryloyloxypropyl diethoxymethylsilane, 3-acryloyloxypropyl ethoxydimethylsilane, 3-methacryloyloxypropyl triethoxysilane, 3-methacryloyloxypropyl diethoxymethylsilane, 3-methacryloyloxypropyl ethoxydimethylsilane, 8-acryloyloxyoctyl triethoxysilane and 8-methacryloyloxyoctyl triethoxysilane; linear and/or branched alkenyl alkoxysilanes such as vinyltrimethoxysilane, vinyldimethoxymethylsilane, vinylmethoxydimethylsilane, allyltrimethoxysilane, allyldimethoxymethylsilane, allylmethoxydimethylsilane, methallyltrimethoxysilane, methallyldimethoxymethylsilane, methallylmethoxydimethylsilane, 4-trimethoxysilyl-1-butene, 5-trimethoxysilyl-1-pentene, 6-trimethoxysilyl-1-hexene, 7-trimethoxysilyl-1-heptene and 8-trimethoxysilyl-1-octene; and aromatic unsaturated alkoxysilanes such as p-trimethoxysilylstyrene, 1,4-divinyl-2-trimethoxysilylbenzene and p-trimethoxysilyl-α-methylstyrene.

3-methacryloyloxypropyl trimethoxysilane (e.g., available under the product name "KBM-503" from Shin-Etsu Chemical Co., Ltd.) is preferred as the vinyl-based monomer unit having an alkoxysilyl group, in view of availability and reactivity.

The vinyl monomer unit A may be copolymerized with the other monomer units B and C in a molar fraction 'a', based on the total amount of the vinyl-based polymer of Formula (I), which is from 1 to 50 wt %, preferably 2 to 40 wt %, and more preferably 5 to 35 wt %. When the amount of vinyl monomer unit A is less than 1 wt % of the total amount of the polymer, forming a network with the inorganic fine particles may become difficult. On the other hand, when the amount of vinyl monomer unit A is more than 50 wt %, the storage stability and weather resistance may decline.

The vinyl monomer unit B is preferably formed by the addition polymerization of a vinyl monomer having an ultraviolet-absorbing group. Any vinyl monomer having both an ultraviolet-absorbing group and a vinylic polymerizable group may be used.

In this invention, ultraviolet (UV) radiation refers to light having a wavelength of about 200 to about 400 nm. Exemplary UV-absorbing groups include organic groups having a benzotriazole, benzophenone, resorcinol or triazine group.

Exemplary vinylic polymerizable groups include organic groups having a vinyl, allyl, styryl, acryl or methacryl group.

Such vinyl monomers having an organic UV-absorbing group are exemplified by (meth)acrylic monomers which have a UV-absorbing group on the molecule, such as the benzotriazole compounds of general formula (III) below and the benzophenone compounds of general formula (IV) below:

[Chem. 3]

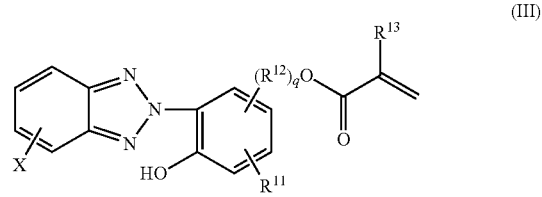

(III)

wherein,
X represents a hydrogen atom or a chlorine atom;
$R^{11}$ represents a hydrogen atom, a methyl group or a tertiary alkyl group of 4 to 8 carbon atoms;
$R^{12}$ represents a linear or branched alkylene group of 2 to 10 carbon atoms;
$R^{13}$ represents a hydrogen atom or a methyl group; and
'q' represents 0 or 1.

[Chem 4.]

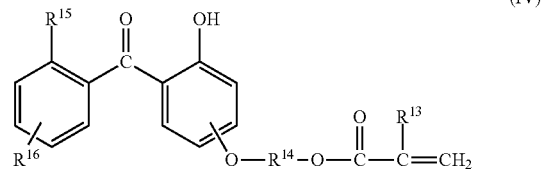

(IV)

wherein,
$R^{13}$ represents a hydrogen atom or a methyl group;
$R^{14}$ represents a linear or branched alkylene group of 2 to 10 carbon atoms which may be substituted or unsubstituted;
$R^{15}$ represents a hydrogen atom or a hydroxyl group; and
$R^{16}$ represents a hydrogen atom, a hydroxyl group or an alkoxy group of 1 to 6 carbon atoms.

In general formula (III), examples of the tertiary alkyl of 4 to 8 carbon atoms represented by $R^{11}$ include tert-butyl, tert-pentyl, tert-hexyl, tert-heptyl, tert-octyl and di-tert-octyl groups.

In general formula (III), examples of the linear or branched alkylene group of 2 to 10 carbon atoms represented by $R^{12}$ include ethylene, trimethylene, propylene, tetramethylene, 1,1-dimethyltetramethylene, butylene, octylene and decylene groups.

In general formula (IV), examples of the linear or branched alkylene group of 2 to 10 carbon atoms represented by $R^{14}$ include the same groups as mentioned above for $R^{12}$, and by groups obtained by replacing some portion of the hydrogen atoms thereon with halogen atoms.

In general formula (IV), examples of the alkoxy group represented by $R^{16}$ include methoxy, ethoxy, propoxy and butoxy groups.

Examples of the benzotriazole compound of general formula (III) include 2-(2'-hydroxy-5'-(meth)acryoxyphenyl)-

2H-benzotriazole, 2-(2'-hydroxy-3'-tert-butyl-5'-(meth) acryloxymethylphenyl)-2H-benzotriazole, 2-[2'-hydroxy-5'-(2-(meth)acryloxyethyl)phenyl]-2H-benzotriazole, 2-[2'-hydroxy-3'-tert-butyl-5'-(2-(meth)acryloxyethyl)-phenyl]-5-chloro-2H-benzotriazole and 2-[2'-hydroxy-3'-methyl-5'-(8-(meth)acryloxyoctyl)phenyl]-2H-benzotriazole.

Examples of the benzophenone compound of general formula (IV) include 2-hydroxy-4-(2-(meth)acryloxyethoxy)benzophenone, 2-hydroxy-4-(4-(meth)acryloxybutoxy)benzophenone, 2,2'-dihydroxy-4-(2-(meth)acryloxyethoxy)benzophenone, 2,4-dihydroxy-4'-(2-(meth)acryloxyethoxy)benzophenone, 2,2',4-trihydroxy-4'-(2-(meth)acryloxyethoxy)benzophenone, 2-hydroxy-4-(3-(meth)acryloxy-2-hydroxypropoxy)benzophenone and 2-hydroxy-4-(3-(meth)acryloxy-1-hydroxypropoxy)benzophenone.

The UV-absorbing vinyl monomer is preferably a benzotriazole compound of formula (III), with the use of 2-[2'-hydroxy-5'-(2-(meth)acryloxyethyl)phenyl]-2H-benzotriazole being especially preferred.

In addition, the UV-absorbing vinyl monomer may be used singly or in combination of two or more kinds thereof.

The vinyl monomer unit B may be copolymerized with the other monomer units A and C in a molar fraction 'b', based on the total amount of the vinyl-based polymer of Formula (I), which is from 5 to 40 wt %, preferably 5 to 30 wt %, and more preferably 8 to 25 wt %. When the amount of vinyl monomer unit B is less than 5 wt % of the total amount of the above vinyl-based polymer, the weather resistance may be inadequate. On the other hand, when the amount of vinyl monomer unit B is more than 40 wt %, adhesion to the substrate may decrease.

Further, the other vinyl monomer unit C that is copolymerizable with vinyl monomer units A and B is not particularly limited so long as it is a copolymerizable monomer. Vinyl monomer unit C is exemplified by (meth)acrylic monomers having a cyclic hindered amine structure, (meth) acrylic esters, (meth)acrylonitrile, (meth)acrylamide, alkyl vinyl ethers, alkyl vinyl esters, styrene, and derivatives thereof.

Examples of (meth)acrylic monomers having a cyclic hindered amine structure include 2,2,6,6-tetramethyl-4-piperidinyl methacrylate and 1,2,2,6,6-pentamethyl-4-piperidinyl methacrylate.

Examples of (meth)acrylic esters and derivatives thereof include the followings:

(meth)acrylic acid esters of monohydric alcohols, such as methyl (meth)acrylate, ethyl (meth)acrylate, n-propyl (meth)acrylate, isopropyl (meth)acrylate, n-butyl (meth) acrylate, isobutyl (meth)acrylate, sec-butyl (meth)acrylate, tert-butyl (meth)acrylate, n-pentyl (meth)acrylate, isopentyl (meth)acrylate, n-hexyl (meth)acrylate, isohexyl (meth) acrylate, n-heptyl (meth)acrylate, isoheptyl (meth)acrylate, 2-ethylhexyl (meth)acrylate, n-octyl (meth)acrylate, isooctyl (meth)acrylate, n-nonyl (meth)acrylate, isononyl (meth) acrylate, n-decyl (meth)acrylate, isodecyl (meth)acrylate, n-undecyl (meth)acrylate, n-dodecyl (meth)acrylate, lauryl (meth)acrylate, palmityl (meth)acrylate, stearyl (meth)acrylate, cyclohexyl (meth)acrylate, 4-methylcyclohexyl (meth) acrylate, 4-tert-butylcyclohexyl (meth)acrylate, isobornyl (meth)acrylate, dicyclopentanyl (meth)acrylate, dicyclopentenyloxyethyl (meth)acrylate and benzyl (meth)acrylate;

(meth)acrylic acid esters of alkoxy(poly)alkylene glycols, such as 2-methoxyethyl (meth)acrylate, 2-methoxypropyl (meth)acrylate, 3-methoxypropyl (meth)acrylate, 2-methoxybutyl (meth)acrylate, 3-methoxybutyl (meth) acrylate, 4-methoxybutyl (meth)acrylate, methoxypolyethylene glycol (meth)acrylate (the number of ethylene glycol units being, for example, 2 to 20) and methoxypolypropylene glycol (meth)acrylate (the number of propylene glycol units being, for example, 2 to 20);

mono(meth)acrylic acid esters of polyhydric alcohols, such as 2-hydroxyethyl (meth)acrylate, 2-hydroxypropyl (meth)acrylate, 3-hydroxypropyl (meth)acrylate, 2-hydroxybutyl (meth)acrylate, 3-hydroxybutyl (meth)acrylate, 4-hydroxybutyl (meth)acrylate, glycerol mono(meth)acrylate, pentaerythritol mono(meth)acrylate, polyethylene glycol mono(meth)acrylate (the number of ethylene glycol units being, for example, 2 to 20) and polypropylene glycol mono(meth)acrylate (the number of propylene glycol units being, for example, 2 to 20);

poly(meth)acrylic acid esters of polyhydric alcohols, such as ethylene glycol di(meth)acrylate, propylene glycol di(meth)acrylate, butylene glycol di(meth)acrylate, glycerol di(meth)acrylate, glycerol tri(meth)acrylate, pentaerythritol di(meth)acrylate, pentaerythritol tetra(meth)acrylate, 1,4-cyclohexanediol di(meth)acrylate, polyethylene glycol di(meth)acrylate (the number of ethylene glycol units being, for example, 2 to 20), and polypropylene glycol di(meth) acrylate (the number of propylene glycol units being, for example, 2 to 20);

poly(esters) of a non-polymerizable polybasic acid and a hydroxyalkyl (meth)acrylate, such as mono[2-(meth)acryloyloxyethyl] succinate, di[2-(meth)acryloyloxyethyl] succinate, mono[2-(meth)acryloyloxyethyl] adipate, di[2-(meth)acryloyloxyethyl] adipate, mono[2-(meth) acryloyloxyethyl] phthalate and di[1-(meth) acryloyloxyethyl] phthalate;

amino group-containing (meth)acrylic esters such as 2-aminoethyl (meth)acrylate, 2-(N-methylamino)ethyl (meth)acrylate, 2-(N,N-dimethylamino)ethyl (meth)acrylate, 2-(N-ethylamino)ethyl (meth)acrylate, 2-(N,N-diethylamino)ethyl (meth)acrylate, 3-(N,N-dimethylamino)propyl (meth)acrylate and 4-(N,N-dimethylamino)butyl (meth) acrylate;

epoxy group-containing (meth)acrylic esters such as glycidyl (meth)acrylate.

Examples of (meth)acrylonitrile derivatives include α-chloroacrylonitrile, α-chloromethylacrylonitrile, α-trifluoromethylacrylonitrile, α-methoxyacrylonitrile, α-ethoxyacrylonitrile and vinylidene cyanide.

Examples of (meth)acrylamide derivatives include N-methyl (meth)acrylamide, N,N-dimethyl (meth)acrylamide, N-ethyl (meth)acrylamide, N,N-diethyl (meth)acrylamide, N-methoxy (meth)acrylamide, N,N-dimethoxy (meth) acrylamide, N-ethoxy (meth)acrylamide, N,N-diethoxy (meth)acrylamide, diacetone (meth)acrylamide, N-methylol (meth)acrylamide, N-(2-hydroxyethyl) (meth)acrylamide, N,N-dimethylaminomethyl (meth)acrylamide, N-(2-dimethylamino)ethyl (meth)acrylamide, N,N-methylenebis(meth) acrylamide and N,N'-ethylenebis(meth)acrylamide.

Examples of alkyl vinyl ethers include methyl vinyl ether, ethyl vinyl ether, butyl vinyl ether and hexyl vinyl ether.

Examples of alkyl vinyl esters include vinyl formate, vinyl acetate, vinyl acrylate, vinyl butyrate, vinyl caproate and vinyl stearate.

Examples of styrene and derivatives thereof include styrene, α-methylstyrene and vinyltoluene.

Of these monomers, (meth)acrylic esters are preferred, with methyl (meth)acrylate, ethyl (meth)acrylate, isopropyl (meth)acrylate, n-butyl (meth)acrylate, isobutyl (meth)acrylate, n-hexyl (meth)acrylate, 2-ethylhexyl (meth)acrylate, isononyl (meth)acrylate, lauryl (meth)acrylate, cyclohexyl (meth)acrylate, 4-methylcyclohexyl (meth)acrylate, 4-tertbutylcyclohexyl (meth)acrylate, isobornyl (meth)acrylate, dicyclopentanyl (meth)acrylate and dicyclopentenyloxyethyl (meth)acrylate being especially preferred.

The vinyl monomer unit C may be used singly or in combination of two or more kinds thereof.

The vinyl monomer unit C may be copolymerized with the other monomer units A and B in a molar fraction 'c', based on the total amount of the vinyl-based polymer of Formula (I), which is [100−(content of monomer unit A)−(content of monomer unit B)] wt %, or from 10 to 94 mol %, preferably 20 to 94 wt %, and more preferably 35 to 90 wt %. When the amount of vinyl monomer unit C, based on the total amount of polymer, is less than 10 wt %, defects in the coated appearance sometimes arise. On the other hand, when the amount of vinyl monomer unit C is more than 94 wt %, crosslinking with the inorganic fine particles is inadequate, which may result in a lower durability.

Component (i) is preferably obtained by subjecting vinyl monomer units A, B and C to a copolymerization reaction. Copolymerization can easily be carried out by adding a peroxide such as dicumyl peroxide or benzoyl peroxide and a radical polymerization initiator selected from among azo compounds, such as azobisisobutyronitrile, to a solution containing monomers A, B and C, and carrying out the reaction under heating (50 to 150° C., especially 70 to 120° C., for 1 to 10 hours, especially 3 to 8 hours).

Component (i) has a polystyrene-equivalent weight-average molecular weight, as determined by gel permeation chromatography (GPC), of preferably between 1,000 and 300,000, and especially between 5,000 and 250,000. At too high a molecular weight, the viscosity becomes too high, which may make synthesis difficult to carry out and the polymer difficult to handle. On the other hand, a molecular weight that is too low may give rise to appearance defects such as whitening of the coating film and weather cracking, and sufficient adhesion, durability and weather resistance may not be obtained.

<Component (ii)>

Component (ii) above used in the present invention is a component for providing the intermediate layer with adhesion to the hard coat layer. Component (ii) is a hydrolytic condensate obtained from (co)hydrolytic condensation of at least one selected from an alkoxysilane of the following general formula (11) and a partial hydrolyzate thereof:

$$R^1_m R^2_n Si(OR^3)_{4-m-n} \quad (II)$$

wherein $R^1$ and $R^2$ are each independently hydrogen or a monovalent C1-C20 hydrocarbon group which may be unsubstituted or have a vinyl polymerizable group, two or more groups of $R^1$ and $R^2$ may bond together, $R^3$ is C1-C3 alkyl, 'm' and 'n' each are 0 or 1, and 'm+n' is 0, 1 or 2.

Examples of the alkoxysilane of formula (II) wherein 'm'='n'=0 include tetraalkoxysilanes (ii-Q) such as tetramethoxysilane, tetraethoxysilane, tetrapropoxysilane and tetrabutoxysilane. Inter alia, tetraethoxysilane is most preferred for availability, reactivity and safety.

Examples of the alkoxysilane of formula (II) wherein 'm'=1 and 'n'=0 include trialkoxysilanes (ii-T) such as methyltrimethoxysilane, ethyltrimethoxysilane, propyltrimethoxysilane, vinyltrimethoxysilane, 3-chloropropyltrimethoxysilane, 3-glycidoxypropyltrimethoxysilane, 2-(3,4-epoxycyclohexyl)ethyltrimethoxysilane, p-styryltrimethoxysilane, 3-methacryloyloxypropyltrimethoxysilane, 3-acryloyloxypropyltrimethoxysilane, 3-methacryloyloxypropyltriethoxysilane, 3-acryloyloxypropyltriethoxysilane, N-2-(aminoethyl)-3-aminopropyltrimethoxysilane, 3-aminopropyltrimethoxysilane, N-phenyl-3-aminopropyltrimethoxysilane, 3-mercaptopropyltrimethoxysilane, and 3-isocyanatopropyltrimethoxysilane. Inter alia, 3-methacryloybxypropyltrimethoxysilane, 3-acryloyloxypropyltrimethoxysilane, and 3-methacryloyloxypropykriethoxysilane are preferred.

Examples of the alkoxysilane of formula (II) wherein 'm'='n'=1 include dialkoxysilanes (ii-D) such as dimethyldimethoxysilane, ethyl(methyldimethoxysilane, 3-chbloropropyldimethoxymethylsilane, 3-glycidoxypropyldimethoxymethylsilane, 2-(3,4-epoxycyclohexyl)ethyldimethoxymethylsilane, p-styryldimethoxymethylsilane, 3-methacryloyloxypropyldimethoxymethylsilane, 3-acryloyloxypropyldimethoxymethylsilane, 3-methacryloyloxypropyldiethoxymethylsilane, 3-acryloyloxypropyldiethoxymethylsilane, N-2-(aminoethyl)-3-aminopropyldimethoxymethylsilane, 3-aminopropyldimethoxymethylsilane, N-phenyl-3-aminopropyldimethoxymethylsilane, 3-mercaptopropyldimethoxymethylsilane, and 3-isocyanatopropyldimethoxymethylsilane. Inter alia, 3-methacryloyloxypropyldimethoxymethylsilane and 3-acryloyloxypropyldimethoxymethylsilane are preferred.

The preferable proportion of a tetraalkoxysilanes (ii-Q), trialkoxysilanes (ii-T), and dialkoxysilanes (ii-D) in the hydrolytic condensate of Component (II) are described as follows:

Tetraalkoxysilanes (ii-Q) may be preferably used in an amount of 30 to 80%, more preferably 40 to 70% by weight based on the total weight of silanes used. If the amount of (ii-Q) exceeds 80 wt %, a coating may become brittle. If the amount of (ii-Q) is less than 30 wt %, a coating may become less receptive to a hardcoat film of inorganic evaporate layer if further deposited thereon.

Trialkoxysilanes (ii-T) may be preferably used in an amount of 20 to 60%, more preferably 25 to 45% by weight based on the total weight of silanes used. If the amount of (ii-T) exceeds 60 wt %, a coating may become brittle. If the amount of (ii-T) is less than 20 wt %, a coating may become less tough.

Dialkoxysilanes (ii-D) may be preferably used in an amount of 0 to 20%, more preferably 5 to 15% by weight based on the total weight of silanes used. Although dialkoxysilanes (ii-D) may be used as desired, without a need to set the lower limit, it is preferably used for imparting toughness. A (ii-D) amount in excess of 20 wt % may lead to degradation of wettability and coating outer appearance.

It is preferred that any one of tetraalkoxysilanes (ii-Q), trialkoxysilanes (ii-T) and dialkoxysilanes (ii-D) have a vinyl polymerizable group. Preferably, one or more may be selected from the foregoing exemplary compounds for each of silanes (ii-Q), (ii-T) and (ii-D), and they may be combined in amounts in the above-defined range.

Component (ii) may be a hydrolytic condensate obtained from (co)hydrolytic condensation of at least one selected from partial hydrolysates of alkoxysilanes having formula (II). The partial hydrolysate of an alkoxysilane refers to a relatively low molecular weight oligomer containing an organic substituent group and alkoxy group per molecule. It may be used for the purpose of adjusting the molecular weight of Component (ii) or controlling reactivity during (co)hydrolytic condensation. Such an oligomer may be prepared by reacting an alkoxysilane with water in an amount of not more than the stoichiometry with respect to alkoxysilyl. Suitable oligomers are commercially available, for example, under the trade name of KC-89S, KR-500, X-40-9225, KR-217, KR-9218, KR-213, KR-510, KR-513, X-40-9227, X-40-9247, X-41-1053, X-41-1056, X-41-1805, X-41-1810, and X-40-2308, all from Shin-Etsu Chemical Co., Ltd.

As mentioned above, Component (ii) is a hydrolytic condensate obtained from (co)hydrolytic condensation of at least one selected from alkoxysilanes having formula (II) and partial hydrolysates thereof. It may be prepared by mixing a premix of a suitable silane(s) with water and/or adding a suitable silane(s) dropwise to water, optionally previously adding a solvent and catalyst to water, and heating the system. The (co)hydrolytic condensation may be performed by a standard technique. Component (ii) may further contain additives such as a viscosity regulator, condensation catalyst and leveling agent as long as the function of Component (ii) is not compromised.

In a preferred embodiment, the hydrolytic condensate of Component (ii) is a hydrolytic condensate obtained from cohydrolysis of a mixture of the alkoxysilane having above formula (II) and/or a partial hydrolysate thereof and a silyl-modified benzophenone compound having the general formula (V) and/or a partial hydrolysate thereof. In this embodiment, the hydrolytic condensate derived from the compound of formula (V) and/or partial hydrolysate thereof preferably accounts for 0.1 to 20%, more preferably 1 to 10% by weight in the hydrolytic condensate of Component (ii).

[Chem. 5]

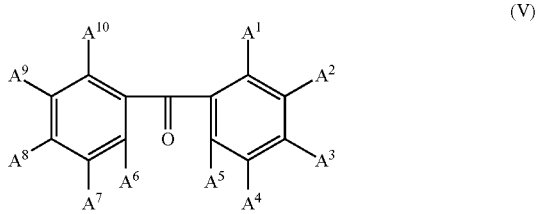

(V)

wherein $A^1$ to $A^{10}$ are each independently hydrogen, hydroxyl, C1-C5 alkyl or a group of the following formula (VI); at least one hydroxyl group and at least one group of formula (VI) are included in formula (V).

[Chem. 6]

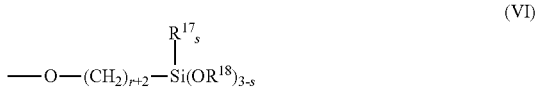

(VI)

wherein,
$R^{17}$ and $R^{18}$ are each independently C1-C5 alkyl,
'r' is an integer of 1 to 5, and
's' is an integer of 0 to 2.

In formula (V), examples of the C1-C5 alkyl group of $A^1$ to $A^{10}$ include straight or branched alkyl groups such as methyl, ethyl, propyl, isopropyl, butyl, isobutyl, sec-butyl, tert-butyl, pentyl, isopentyl, and neopentyl.

In formula (VI), examples of the C1-C5 alkyl group of $R^{17}$ and $R^{18}$ include straight or branched alkyl groups such as methyl, ethyl, propyl, isopropyl, butyl, isobutyl, sec-butyl, tert-butyl, pentyl, isopentyl, and neopentyl. Inter alia, methyl is most preferred. The subscript r is an integer of 1 to 5, preferably 3, and s is an integer of 0 to 2, preferably 0 or 1, more preferably 0.

A compound containing a group of formula (VI) wherein s=0 is classified to the above trialkoxysilanes (ii-T) and therefore, it is preferably subject to (co)hydrolysis in an amount in the above preferred range. A compound containing a group of formula (VI) wherein s=1 is classified to the above dialkoxysilanes (ii-D) and therefore, it is preferably subject to (co)hydrolysis in an amount in the above preferred range. A compound containing a group of formula (VI) wherein s=2 is not classified to any of the above tetraalkoxysilanes (ii-Q), trialkoxysilanes (ii-T) and dialkoxysilanes (ii-D), and it is preferably subject to (co)hydrolysis in an amount of up to 5%, more preferably up to 3% by weight based on the hydrolytic condensate as Component (ii).

Examples of the compounds having formulae (V) and (VI) include [2-hydroxy-4-(3-(trimethoxysilyl)propoxy)] benzophenone, [2-hydroxy-4-(3-(triethoxysilyl)propoxy)] benzophenone, [2-hydroxy-4-(3-(dimethoxymethylsilyl) propoxy)]benzophenone, and [2-hydroxy-4-(3-methoxydimethylsilyl)propoxy]]benzophenone.

Preferable Example of the compounds having formulae (V) and (VI) is [2-hydroxy-4-(3-(trimethoxysilyl)propoxy)] benzophenone.

Preferably Component (ii) has a weight average molecular weight (Mw) of 500 to 8,000, more preferably 800 to 5,000, even more preferably 1,000 to 3,000, as measured by GPC versus polystyrene standards. If MW is less than 500, problems may arise like insufficient storage stability and coating brittleness. If MW is more than 8,000, problems may arise like insufficient coating hardness and less compatibility with other Component (i) and Components (iii) to (vii).

Component (ii) is preferably contained 200 to 500 parts by weight, more preferably contained 250 to 480 parts by weight, relative to 100 parts by weight of Component (i).

<Component (iii)>

Component (iii) is a component for improving weather resistance of the structure. Component (iii) is core-shell type tetragonal titanium oxide solid-solution fine particles having a core of tetragonal titanium oxide fine particles containing tin and manganese in the form of solid solution and a shell of silicon oxide outside the core. The cores have a volume basis 50% cumulative distribution diameter (D50) of up to 30 nm, and the core-shell type microparticles have a volume basis 50% cumulative distribution diameter (D50) of up to 50 nm, as measured by the dynamic light scattering method. The amount of tin incorporated in solid solution is to provide a molar ratio of titanium to tin (Ti/Sn) of 10/1 to 1,000/1, and the amount of manganese incorporated in solid solution is to provide a molar ratio of titanium to manganese (Ti/Mn) of 10/1 to 1,000/1.

When tin and manganese are incorporated in solid solution form in tetragonal titanium oxide, the amount of tin incorporated in solid solution is to provide a molar ratio of titanium to tin (Ti/Sn) of 10/1 to 1,000/1, preferably 20/1 to 200/1, and the amount of manganese incorporated in solid solution is to provide a molar ratio of titanium to manganese (Ti/Mn) of 10/1 to 1,000/1, preferably 20/1 to 200/1. If the amount of tin and manganese in solid solution form is to provide a molar ratio Ti/Sn and Ti/Mn of less than 10/1, there may be observed considerable light absorption in the visible region assigned to tin and manganese. If the amount of tin or manganese in solid solution form is to provide a molar ratio Ti/Sn or Ti/Mn of more than 1,000/1, then the photocatalytic activity is not fully deprived and the crystal system may take the anatase type having a low visible light absorptivity.

The shell of silicon oxide formed around the core of microparticulate tetragonal titanium oxide having tin and manganese incorporated in solid solution contains silicon oxide as the major component and may contain another component such as tin or aluminum, while it may be formed by any desired techniques. For example, the shell of silicon oxide may be formed by hydrolytic condensation of a tetraalkoxysilane.

Suitable tetraalkoxysilanes include tetramethoxysilane, tetraethoxysilane, tetra(n-propoxy)silane, tetra(i-propoxy)silane, and tetra(n-butoxy)silane, which are commonly available, with tetraethoxysilane being preferred from the aspects of reactivity and safety. As the silane, for example, KBE-04 commercially available from Shin-Etsu Chemical Co., Ltd. may be used.

Hydrolytic condensation of a tetraalkoxysilane may be conducted in water, optionally in the presence of a condensation catalyst such as ammonia, aluminum salts, organoaluminum compounds, tin salts, or organotin compounds. Inter alia, ammonia is especially preferred since it can simultaneously function as a dispersing agent for the microparticulate cores.

The tetraalkoxysilane may be used in such an amount that silicon oxide accounts for 20 to 50%, preferably 25 to 45%, and more preferably 30 to 40% by weight based on the weight of silicon oxide-coated titanium oxide after hydrolysis. An amount of silicon oxide of less than 20 wt % may indicate insufficient shell formation whereas an amount in excess of 50 wt % may promote the agglomeration of the microparticles so that the dispersion becomes opaque.

In the core-shell type tetragonal titanium oxide solid-solution particles, cores of tetragonal titanium oxide having tin and manganese incorporated in solid solution should have a volume basis 50% cumulative distribution diameter (D50) of up to 30 nm, preferably up to 20 nm, and the core-shell type tetragonal titanium oxide solid-solution particles should have a volume basis 50% cumulative distribution diameter (D50) of up to 50 nm, preferably up to 30 nm, both as measured by the dynamic light scattering method using laser light.

If the D50 value of the microparticulate cores or the core-shell type solid-solution particles exceeds the upper limit, undesirably the dispersion may become opaque. The lower limit of D50 of the microparticulate cores is at least 5 nm, and the lower limit of D50 of the core-shell type solid-solution particles is at least 6 nm. It is noted that the volume basis 50% cumulative distribution diameter (D50, also referred to as "average particle size") may be measured by an instrument such as Nanotrac UPA-EX150 (Nikkiso Co., Ltd.).

Component (iii) may be formulated by a technique of adding Component (iii) in solid state to a composition and mechanically dispersing or a technique of adding a colloidal solution of Component (iii) dispersed in a solvent, which maintains the primary particle size. The technique of adding a colloidal solution of Component (iii) is preferred.

Suitable dispersing solvents for the colloidal solution include water, methanol, ethanol, propanol propylene glycol monomethyl ether, and propylene glycol monomethyl ether acetate, with water and ethanol being preferred. The colloidal solution preferably has a concentration of 1 to 40%, more preferably 5 to 30%, and even more preferably 10 to 20% by weight of dispersed particles or Component (iii). A concentration of less than 1 wt % indicates a predominant proportion of the solvent which may break the balance of the composition whereas a colloidal solution with a concentration in excess of 40 wt % may encounter practical problems such as gelation and flocculation by solvent shock during formulation.

Component (iii) may be prepared by the known method in the prior art (JP2014-019611A).

Component (iii) is preferably contained 10 to 40 parts by weight, more preferably contained 12 to 20 parts by weight, relative to 100 parts by weight of Component (i).

<Component (iv)>

Component (iv) used in the present invention is a polycarbonate and/or polyester-based urethane-modified vinyl polymer excluding Component (i).

Since Component (iv) is free of an alkoxysilyl group, it does not fall in the scope of Component (i). Vinyl polymers containing neither a polycarbonate and/or polyester-based urethane modifying group nor an alkoxysilyl group do not fall in the scope of Components (i) and (iv). Vinyl polymers containing both a polycarbonate and/or polyester-based urethane modifying group and an alkoxysilyl group do not fall in the scope of Component (iv), but some fall in the scope of Component (i). There exists a vinyl polymer corresponding to a special form of Component (i) in which vinyl base monomer unit C contains a polycarbonate and/or polyester-based urethane modifying group and satisfying the conditions of Component (i). In the invention, such a special case is not excluded. In this case, the relevant vinyl polymer may be formulated as Component (i) in the composition although it possesses a polycarbonate and/or polyester-based urethane modifying moiety.

Component (iv) is a polycarbonate and/or polyester-based urethane-modified vinyl polymer, which serves as an adhesion improver. In the cured coating, Component (iv) is present as a separate phase from the other components and has a graded concentration in a thickness direction of the coating so that it serves to increase affinity to the organic resin substrate without any loss of scratch resistance performance, thereby achieving adhesion. The polycarbonate and/or polyester-based urethane-modified vinyl polymer as Component (iv) is a vinyl-based polymer having polycarbonate or polyester-based urethane grafted thereto. Illustratively, the polymer is preferably a vinyl-based polymer having as side chain a polycarbonate or polyester-based urethane obtained from reaction of an aliphatic polycarbonate diol or aliphatic polyester diol with an aromatic diisocyanate, more preferably a vinyl-based polymer having as side chain a polycarbonate-based urethane obtained from reaction of an aliphatic polycarbonate diol with an aromatic diisocyanate.

Examples of the aliphatic polycarbonate diol include 1,4-tetramethylene, 1,5-pentamethylene, 1,6-hexamethylene, 1,12-dodecane, and 1,4-cyclohexane types and mixtures thereof. Examples of the aromatic isocyanate include 4,4'-diphenylmethane diisocyanate, 2,4-tolylene diisocyanate, 2,6-tolylene diisocyanate, m-xylene diisocyanate, naphthalene diisocyanate, and mixtures thereof. By reacting such a diol with a diisocyanate in a standard manner, a polycarbonate-based polyurethane is obtainable.

As the monomer from which the vinyl-based polymer is derived, any monomer having a polymerizable vinyl group may be used. Suitable monomers include methyl(meth)acrylate, ethyl(meth)acrylate, butyl(meth)acrylate, cyclohexyl(meth)acrylate, glycidyl(meth)acrylate, 2-hydroxyethyl(meth)acrylate, (meth)acrylic acid, styrene, and vinyl acetate.

By polymerizing such a monomer or monomers in a standard manner, a vinyl-based polymer is obtainable.

The urethane-modified vinyl polymer as Component (iv) is preferably available as an organic solvent solution because of ease of synthesis and ease of handling. The organic solvent used herein is preferably a relatively polar organic solvent in which Component (iv) is readily dissolved. Suitable organic solvents include alcohols such as isopropyl alcohol, n-butanol, isobutanol, tert-butanol, and diacetone alcohol, ketones such as methyl ethyl ketone, diethyl ketone, methyl isobutyl ketone, cyclohexanone, and diacetone alcohol, ethers such as dipropyl ether, dibutyl ether, anisole, dioxane, ethylene glycol monoethyl ether, ethylene glycol monobutyl ether, propylene glycol monomethyl ether, and propylene glycol monomethyl ether acetate, and esters such as ethyl acetate, propyl acetate, butyl acetate, and cyclohexyl acetate.

The polycarbonate and/or polyester-based urethane-modified vinyl polymer as Component (iv) should preferably have a weight average molecular weight (Mw) of 5,000 to 50,000, more preferably 7,000 to 40,000, as measured versus polystyrene standards by GPC. If Mw<5,000, sufficient adhesion to the organic resin substrate may not be available. If Mw>50,000, Component (iv) may become less soluble in the composition or separate out, and the cured coating may become less transparent.

The polycarbonate and/or polyester-based urethane-modified vinyl polymer as Component (iv) preferably has a hydroxyl number of at least 10, more preferably 20 to 100, based on the solids content of Component (iv). If the hydroxyl number of Component (iv) is less than 10, Component (iv) may become less compatible with the composition or separate out.

It is noted that Component (iv) is commercially available, for example, under the trade name of Akurit 8UA-347, 357 and 366 (polycarbonate base) and Akurit 8UA-140, 146, 301 and 318 (polyester base) from Taisei Fine Chemical Co., Ltd.

Component (iv) is preferably contained 10 to 40 parts by weight, more preferably contained 12 to 30 parts by weight, relative to 100 parts by weight of Component (i).

<Component (v)>

Component (v) used in the present invention is a vinyl polymerizable monomer free of alkoxysilyl, which does not form a polymer and/or condensate prior to irradiation of actinic energy radiation and does not correspond to Components (i) and (ii).

Since Component (v) is a monomer prior to irradiation of actinic energy radiation, it does not fall in the scope of Component (i). Vinyl polymerizable monomers having an alkoxysilyl group do not fall in the scope of Component (v), but some fall in the scope of Component (ii). There is a possibility that even after an alkoxysilane having a vinyl polymerizable group constituting one of units of Component (ii) is subjected to hydrolytic condensation, a part of the monomer is left behind. Such a special case is not excluded from the invention. In this case, the relevant monomer may be considered and formulated as Component (ii) in the composition although it possesses a vinyl polymerizable group.

Suitable vinyl polymerizable monomers as Component (v) used in the present invention include (meth)acrylic esters formed from (meth)acrylic acid and (polyhydric) alcohols and (meth)acrylic acid.

Examples of the (meth)acrylic esters of (meth)acrylic acid with (polyhydric) alcohols include monoesters such as methyl methacrylate (MMA), methyl acrylate (MA), ethyl methacrylate, ethyl acrylate, hydroxyethyl acrylate (HEA), hydroxyethyl methacrylate (HEMA), hydroxypropyl acrylate, 4-hydroxybutyl acrylate, isobutyl acrylate, tert-butyl acrylate, n-octyl acrylate, isooctyl acrylate, isononyl acrylate, lauryl acrylate, stearyl acrylate, isostearyl acrylate, isonorbornyl acrylate, tetrahydrofurfuryl acrylate, methoxyethyl acrylate, methoxypolyethylene glycol acrylate, 2-methyl-2-ethyl-1,3-dioxolan-4-yl acrylate, [{cyclohexanespiro-2-(1,3-dioxolan-4-yl)}methyl]acrylate, and [(3-ethyloxetan-3-yl)methyl]acrylate; diesters such as ethylene glycol diacrylate, propylene glycol diacrylate, butanediol diacrylate, pentanediol diacrylate, hexanediol diacrylate, heptanediol diacrylate, octanediol diacrylate, nonanediol diacrylate, decanediol diacrylate, glycerol 1,2-diacrylate, glycerol 1,3-diacrylate, pentaerythritol diacrylate, 2-hydroxy-3-acryloyloxypropyl methacrylate, tricyclodecane dimethanol diacrylate, dipropylene glycol diacrylate, and tripropylene glycol diacrylate; and polyfunctional esters such as glycerol triacrylate, trimethylolptopane triacrylate, pentaerythritol triacrylate, dipentaerythritol triacrylate, ethoxylated isocyanuric acid triacrylate, ethoxylated glycerol triacrylate, ethoxylated trimethylolpropane triacrylate, pentaerythritol tetraacrylate, dipentaerythritol hexaacrylate, ditrimethylolpropane tetraacrylate, ethoxylated pentaerythritol tetraacrylate, trimethylolpropane trimethacrylate, and trispentaerythritol octaacrylate.

The monoester may be used in an amount of 0 to 70%, preferably 0 to 60%, and more preferably 0 to 50% by weight based on the total weight of Component (v), i.e., esters. The diester may be used in an amount of 1 to 30%, preferably 2 to 25%, and more preferably 5 to 20% by weight based on the total weight of esters. The polyfunctional ester may be used in an amount of 50 to 100%, preferably 50 to 900%, and more preferably 50 to 80% by weight based on the total weight of esters.

Although the monoester is optional, it is important from the aspect of reducing or eliminating the solvent content of a coating composition and may be used instead of solvent. If the amount of monoester exceeds 70 wt %, a coating may become brittle. If the amount of diester is less than 1 wt %, a coating may become less flexible. If the amount of diester exceeds 30 wt %, a coating may have poor scratch resistance. The polyfunctional ester is essential, and a coating may have a low hardness if its content is less than 50 wt %.

Component (v) is preferably contained 200 to 800 parts by weight, more preferably contained 250 to 600 parts by weight, relative to 100 parts by weight of Component (i).

Component (v) is a component for improving surface flatness of the coat layer and adhesive between the coat layer and CVD layer. Although Component (v) is an optional component, the component can broaden the scope of preferable content range of each components in the coating composition and then play important role for combining abrasion resistance and weather resistance. The component is siloxane acrylates represented by the general formula (IIIa) wherein $R^1$, $R^2$, $R^3$, and $R^4$ each independently represent a hydrogen atom or a methyl group; $Y^1$, $Y^2$, $Y^3$, and $Y^4$ each independently represent an alkylene group having 1 to 10 carbon atoms; and 'n' represents an integer of from 1 to 10.

In general formula (IIIa), $R^1$, $R^2$, $R^3$, and $R^4$ are each independently a hydrogen atom or a methyl group, and are preferably a hydrogen atom. $Y^1$, $Y^2$, $Y^3$, and $Y^4$ are each independently an alkylene group of 1 to 10 carbon atoms that to may be branched, preferred examples of which include methylene, ethylene, propylene, butylene, pentylene, hexylene, heptylene, octylene, ethylhexylene, nonylene and decylene. Ethylene, butylene, hexylene and octylene are more preferred, and ethylene is even more preferred. The letter "n" is an integer of at least 1 and up to 10, preferably at least 1 and up to 8, and more preferably at least 2 and up to 5.

The siloxane acrylate of general formula (IIIa) can be prepared by preferably reacting a silicate with a ω-functional alkylene alcohol bearing a (meth)acrylate group. Examples of preferred silicates include tetraalkoxysilanes such as tetramethoxysilane and tetraethoxysilane; and silicate oligomers such as Methyl Silicate 51, Methyl Silicate 53A, Ethyl Silicate 40 and Ethyl Silicate 48 (all available from Colcoat Co., Ltd.), and X-40-2308 (available from Shin-Etsu Chemical Co., Ltd.). Preferred ω-functional alkylene alcohols bearing a (meth)acrylate group include hydroxymethyl acrylate, hydroxyethyl acrylate, hydroxypropyl acrylate, hydroxybutyl acrylate and hydroxyoctyl acrylate.

Although siloxane acrylates represented by the general formula (IIIa) can be produced by any synthetic method, a method of interesterification between an oligomer of orthosilicate ester, such as methyl silicate, and o-hydroxy (meth)acrylates is preferable in view of simplicity. If they are obtained by this method, there may be a site where the interesterification reaction has been stopped. However, such impurities may be acceptable if the present invention can provide the effects.

Component (vi) is preferably contained 20 to 400 parts by weight, more preferably contained 50 to 300 parts by weight, relative to 100 parts by weight of Component (i).
<Component (vii)>

Component (vii) used in the present invention is at least one microparticulate inorganic oxide selected from the group consisting of silicon oxide, cerium oxide and zinc oxide while it is formulated into the composition if desired. Sometimes, it is necessary to blend Component (vii) for the purpose of additionally reinforcing film physical properties. For example, silicon oxide is blended for the purpose of further improving the scratch resistance of a cured coating alone. Cerium oxide or zinc oxide is blended for the purpose of improving the light absorptivity in the near-UV region.

The inorganic oxide particles as Component (vii) should preferably have a volume basis 50% cumulative distribution diameter (D50) of 1 to 100 nm, more preferably 5 to 50 nm, and even more preferably 10 to 30 nm, as measured by the dynamic light scattering method. Particles with a D50 of less than 1 nm are low in dispersion stability whereas particles with a D50 in excess of 100 nm may detract from transparency.

Component (vii) is preferably contained 50 to 450 parts by weight, more preferably contained 100 to 400 parts by weight, relative to 100 parts by weight of Component (i).
<Other Components>

The composition of the present invention can be formulated other components, such as ultraviolet absorbers, light stabilizers, coloring agents, and various surfactants, if necessary.

Examples of ultraviolet absorbers include Benzophenones, such as 2,4-dihydroxybenzophenone, 2-hydroxy-4-methoxybenzophenone, 2-hydroxy-4-octoxybenzophenone, 2,2'-dihydroxy-4,4'-dimethoxybenzophenone; benzotriazoles, such as 2-(5'-methyl-2'-hydroxyphenyl)benzotriazole, 2-(3'-t-butyl-5'-methyl-2'-hydroxyphenyl)benzotriazole, 2-(3',5'-di-t-butyl-2'-hydroxyphenyl)-5-chlorobenzotriazole; hydroxyphenyltriazines, such as 2-[4-[(2-hydroxy-3-dodecyoxypropyl)oxy]-2-hydroxyphenyl]-4,6-bis(2,4-dimethylphenyl)-1,3,5-triazine, 2-[4-[(2-hydroxy-3-tridecyoxypropyl)oxy]-2-hydroxyphenyl]-4,6-bis(2,4-dimethylphenyl)-1, 3,5-triazine, 2-[4-[(2-hydroxy-3-(2'-ethyl)hexyl)oxy]-2-hydroxyphenyl]-4,6-bis(2,4-dimethylphenyl)-1,3,5-triazine, and 2-(2-hydroxy4-[1-octyloxycarbonylethoxy]phenyl)-4,6-bis(4-phenylphenyl)-1,3,5-triazin; cyanoacrylates, such as ethyl-2-cyano3,3-diphenylacrylate, 2-ethylhexyl-2-cyano-3, 3-diphenylacrylate; salicylates, such as phenylsalicylate, p-octylphenylsalicylate; benzylidenemalonates, such as diethyl-p-methoxybenzylidenemalonate, bis(2-ethylhexyl) benzylidenemalonate. Examples of light stabilizers include hindered amines, such as 1,2,2,6,6-pentamethyl-4-piperidylmethacrylate, bis(2,2,6,6-tetramethyl-1-octyloxy-4-piperidinyl)didecanoate, bis(1,2,2,6,6-pentamethyl-4-piperidinyl)-[[3,5-bis(1-dimethylethyl)-4-hydroxyphenyl]methyl] butylmalonate, 2,4-bis[N-butyl-N-(1-cyclohexyloxy-2,2,6, 6-tetramethylpiperidin-2-yl)amino]-6-(2-hydroxyethylamine)-1,3,5-triazine, bis(1,2,2,6,6-pentamethyl-4-piperidinyl)sebacate, methyl(1,2,2,6,6-pentamethyl-4-piperidinyl)sebacate, bis(2,2,6,6-tetramethyl-4-piperidyl)carbonate, bis(2,2,6,6-tetramethyl-4-piperidyl)succinate, bis(2,2,6,6-tetramethyl-4-piperidyl)sebacate, 4-benzoyloxy-2,2,6,6-tetramethylpiperidine, 4-octanoyloxy-2,2,6,6-tetramethylpiperidine, bis(2,2,6,6-tetramethyl-4-piperidyl) diphenylmethane-p,p'-dicarbamate, bis(2,2,6,6-tetramethyl-4-piperidyl)benzene-1,3-disulfonate, and bis(2,2,6,6-tetramethyl-4-piperidyl)phenyl phosphite, and nickel complexes, such as nickel bis (octylphenyl sulfide, nickel complex-3,5-di-t-butyl-4-hydroxybenzyl phosphate monoethylate, and nickel dibutyldithiocarbamate.

These ultraviolet absorbers and light stabilizers may be used singly or in combination of two or more kinds thereof.
<Inorganic Component Percentage X>

The inorganic component percentage X of the resin composition of the present invention is from 0.2 to 0.8, preferably from 0.25 to 0.8, and more preferably from 0.28 to 0.75. Setting the inorganic component percentage X within the above range improves the adhesion between the intermediate layer and the organic resin substrate layer, and further enables film formation of the hard coat layer that is obtained by directly plasma polymerizing a silicon compound on the intermediate layer. In other words, film formation of the hard coat layer can be achieved by simply providing the intermediate layer as a single layer on the organic resin substrate layer.
<Curing by Active Energy Ray>

On the organic resin substrate, the above-mentioned acrylic silicone resin composition is cured by an active energy ray to form the intermediate layer.

Specific examples of the active energy ray include ultraviolet light, X rays, gamma rays, beta rays, alpha rays, electron beams, plasma currents, neutron beams, and proton beams. Among them, electron beams and ultraviolet light are commonly used due to easy management of irradiation conditions and equipment therefor.

When compared between electron beams and ultraviolet light, electron beams are larger in energy possessed (transmitted) by smallest unit particles that transmit energy, and thus can efficiently cure an active energy ray curable layer, thus enabling curing of the layer while preventing deterioration of the organic resin substrate.

On the other hand, curing using ultraviolet light also enables an active energy ray curable layer to be cured at a level appropriate in various kinds of applications, and is easier in terms of management of irradiation conditions and equipment than electron-beam curing, so that ultraviolet curing is widely used.

Even when curing the intermediate layer in the present application, curing by ultraviolet irradiation enables the intermediate layer to be cured to a degree enough to prevent negative influence due to deterioration of the intermediate layer that results from the plasma irradiation in the next step.

Regarding curing conditions in ultraviolet curing, those for allowing reaction of all reactive groups of an active energy ray curable resin are not used because increase of coat (curing) cost due to deterioration of the organic resin substrate and increase of tact time generally becomes too large to ignore. Those preferably selected are conditions under which from 70 to 95% of the reactive groups react.

Generally, curing is performed at a cumulative irradiation dose of preferably from 300 to 10,000 mJ/cm². In this range, the acrylic silicone resin composition can be appropriately cured, and the increase of coat (curing) cost due to the deterioration of the organic resin substrate and the increase of tact time can be reduced to a minimum level, which is preferable.

In curing by electron-beam irradiation, it is preferable to select conditions under which 99% or more of the reactive groups in the active energy curable resin react. Irradiation dose at an acceleration voltage of generally about from 70 to 300 kV is selected in a range of usually from 5 to 300 kGy (from 0.5 to 30 Mrad), and preferably from 10 to 50 kGy (from 1 to 5 Mrad).

The electron beam source is not particularly limited, and examples thereof include various types of electron beam accelerators, such as Cockroft Walton type, Van de Graaff type, resonance transformer type, insulated core transformer type, linear type, Dynamitron type, and high frequency type accelerators.

<Organic Resin Substrate>

Examples of the organic resin substrate include polyolefin resins such as polyethylene and polypropylene, amorphous polyolefin resins such as polydicyclopentadiene, polycarbonate resins, acrylic resins such as polymethyl methacrylate, polyester resins such as polyethylene terephthalate, polybutylene terephthalate, and poly(ethylene-2,6-naphthalate), polystyrene, polyarylate, polyether sulfone, polyether ether ketone, polyimide, phenol resins, and urea resins. Among them, preferred are polycarbonate resins, acrylic resins such as polymethyl methacrylate, polyester resins such as polyethylene terephthalate, polybutylene terephthalate, and poly(ethylene-2,6-naphthalate), polystylene, polypropylene, polyarylate, and polyether sulfone, which are excellent in transparency. Furthermore, more preferred are polycarbonate resins having high impact strength.

In addition, the organic resin substrate layer may be a single layer or may include a plurality of layers including a base resin and a cap layer that are coextruded or laminated together. When the organic resin substrate layer is a single layer, it is preferable in that the organic resin substrate layer can be easily formed. When the organic resin substrate layer includes a plurality of layers, it is preferable in that a substrate having advantages of both organic resins to be used can be formed at one step.

<<Step (2): Step of Dry Etching Surface of Intermediate Layer>>

A surface of the intermediate layer obtained in step (1) is dry etched with a non-oxidizing gas plasma so as to satisfy the following Formulae 1 and 2:

$Y > 5/3 \times (10 \times X + 13)$      Formula 1:

(i.e., $6 \times Y - 100 \times X > 130$)

$Y < 275 \times X - 30)$      Formula 2:

(i.e., $Y - 275 \times X < -30$)

wherein Y represents a plasma irradiation dose (J/cm²).

Ranges indicated by the Formulae are specifically represented by a triangular range enclosed by lines in FIG. 1.

Formula 1 is a formula that indicates, in relation to a value of each inorganic component percentage X of the acrylic silicone resin composition, the lower limit value of a plasma irradiation dose necessary for activation of the surface of the intermediate layer, which is necessary to ensure adhesion with the hard coat layer that is formed by plasma polymerizing an organosilicon compound.

By performing plasma irradiation at the value of the inorganic component percentage X of the acrylic silicone resin composition in the range defined by Formula 1, the intermediate layer is provided with surface roughness and hydrophilicity enough to ensure the adhesion with the hard coat layer.

Note that, regarding Formula 1, the following thing has been found: when a thermosetting siloxane resin containing no acrylic component is used for the intermediate layer, the plasma irradiation dose indicated by Formula 1 is not sufficient, and there is a region where it is impossible to ensure the adhesion between the intermediate layer and the surface of the hard coat layer formed by plasma polymerizing an organosilicon compound. Details of the reason are unclear. However, in the acrylic silicone resin composition, an acrylic resin portion activated by plasma irradiation contributes to activation of a silicone portion in the hard coat layer. Thus, it is considered that the adhesion between the acrylic silicone resin composition and the hard coat layer can be ensured at a small irradiation dose.

On the other hand, Formula 2 is a formula that indicates, in relation to the inorganic component percentage X of the acrylic silicone resin composition, the upper limit value of a plasma irradiation dose that can ensure adhesion and appearance by avoiding decomposition and deterioration of the acrylic silicone resin.

By irradiation with plasma at the value of the inorganic component percentage X of the acrylic silicone resin composition in the range defined by Formula 2, there can be obtained favorable adhesion properties (after initial and durability tests) with respect to the hard coat layer formed by plasma polymerizing an organosilicon compound, without causing decomposition and deterioration of the intermediate layer surface.

Note that, regarding Formula 2, the following thing has been found: when a thermosetting siloxane resin containing no acrylic component is used for the intermediate layer, even plasma irradiation at a dose higher than the plasma irradiation dose indicated by Formula 2 enables lamination of the hard coat layer formed by plasma polymerizing an organosilicon compound without causing any negative influence on the appearance and adhesion of the laminate; however, when using the acrylic silicone resin composition used in the present invention, the adhesion (after initial and durability tests) cannot be obtained without satisfying Formula 2. Details of the reason are unclear. It is however considered that decomposition of the acrylic component not only causes performance degradation due to deterioration of the acrylic silicone resin composition layer, but also a decomposition product thereof negatively affects formation of the hard coat layer that is obtained by plasma polymerization of an organosilicon compound, thereby affecting the appearance and adhesion of the laminate. On the other hand, when using a thermosetting siloxane resin layer containing no acrylic component, negative effect of plasma irradiation seems to be only due to deterioration of the siloxane resin layer. Thus, the appearance and adhesion of the laminate seem to become favorable even when plasma irradiation is performed at an irradiation dose higher than estimated from Formula 2.

Thus, conditions for plasma irradiation on the surface of the intermediate layer formed from the acrylic silicone resin composition used in the present invention cannot be estimated from those for plasma irradiation on the surfaces of conventional thermosetting siloxane resin compositions.

Preferable ranges of the Formulae are as follows:

$$Y > 5/3 \times (10 \times X + 14) \quad \text{Formula 1:}$$

(i.e., $6 \times Y - 100 \times X > 140$)

$$Y < 275 \times X - 60 \quad \text{Formula 2:}$$

(i.e., $Y - 275 \times X < -60$).

In the above ranges, the adhesion after a durability test becomes favorable, which is preferable.

Additionally, plasma irradiation is preferably performed such that the intermediate layer surface has a water contact angle of 40° or less and a surface roughness of from 0.7 to 5 nm. In the surface state, the surface is one that has been sufficiently activated, and a contact area between the resin layer and the hard coat layer that is obtained by plasma polymerization of an organosilicon compound can be sufficiently ensured. Accordingly, the resin layer and the hard coat layer strongly adhere to each other, improving adhesion after a weather resistance test. When the surface roughness of the intermediate layer is 5 nm or less, it is preferable because there is no negative influence on the adhesion thereof with the hard coat layer and the appearance.

Note that the plasma irradiation dose Y (J/cm²) is an amount represented by a product of plasma irradiation intensity (W/cm²) and irradiation time (seconds), and treatment status of the intermediate layer surface can be represented by the amount. However, more precisely, even in the case of the same irradiation dose, the degrees of activation and deterioration of the intermediate layer surface vary depending on the combination of plasma irradiation intensity and irradiation time and the type of the gas to be introduced.

The gas to be introduced is preferably among the elemental gases found in Group 18, among which argon is most preferable.

When the plasma irradiation intensity is large, deterioration of the intermediate layer occurs with higher priority than activation of the intermediate layer surface. Thus, the smaller the plasma irradiation intensity is, the more desirable it seems. However, in fact, lowering the plasma irradiation intensity leads to a longer irradiation time, and also makes it difficult to stably generate and maintain plasma. The plasma intensity is preferably from 0.05 to 1.5 W/cm² (from 180 to 5400 W when using a parallel flat plate-type 60 cm square electrode), and more preferably from 0.1 to 1 W/cm² (from 360 to 3600 W when using a parallel flat plate-type 60 cm square electrode). Additionally, the plasma intensity is, for example, from 0.1 to 0.5 W/cm², from 0.1 to 0.4 W/cm², or from 0.1 to 0.3 W/cm².

By performing plasma treatment under conditions within the above range using plasma generated under such conditions, the step of plasma polymerizing an organosilicon compound to form a hard coat layer can be suitably performed.

<<Step (3): Hard Coat Layer Formation Step>>

A hard coat layer is formed by plasma polymerizing an organosilicon compound on the surface of the intermediate layer obtained in step (2).

In an embodiment, the hard coat layer is a hard film that includes silicon, oxygen, carbon, and hydrogen atoms formed by plasma polymerization and oxidation of an organosilicon compound. More specifically, the above-mentioned hard film can be laminate-formed by a capacitively coupled plasma method. The techniques can be understood by referring to Japanese Unexamined Patent Publication (Kokai) Nos. 2010-253683, 2011-16257, 2012-224077, 2012-232591, etc.

The composition and film quality (such as density) of the hard coat layer can be gradually changed, for example, by simultaneously continuously changing all of plasma three conditions, i.e., electric power to be input, the total amount of a gas to be introduced, and a ratio between a plasma generating carrier gas such as oxygen or argon and an organosilicon compound gas.

Thus, continuously changing the composition and film quality of the hard coat layer enables various kinds of performance, such as adhesion with the intermediate layer, abrasion resistance, heat resistance (heat impact resistance), and gas barrier properties, to be achieved in a highly balanced manner.

An average composition of the organosilicon compound to be used in plasma polymerization is preferably represented by the following Formula (A):

$$(SiH_xO_yR_z)_n \quad \text{Formula (A):}$$

wherein

R represents a hydrocarbon group having 1 to 8 carbon atoms, an alkoxy group having 1 to 4 carbon atoms, a carboxy group having 1 to 4 carbon atoms, an amino group, a methylamino group, a dimethylamino group, or a hydroxy group;

'x' represents from 0.5 to 2;
'y' represents from 0.1 to 1;
'z' represents from 0.5 to 1.5; and
'n' represents from 1 to 6.

The thickness of the hard coat layer is preferably from 3.5 to 20.0 μm, more preferably from 3.5 to 9.0 μm, still more preferably from 4.0 to 8.0 μm, and most preferably from 4.5 to 7.0 μm. In the thickness range, all of abrasion resistance, heat resistance, and adhesion can be satisfied, which is preferable. When the hard coat layer is thinner than 3.5 μm, necessary abrasion resistance cannot be obtained. When the thickness of the hard coat layer is larger than 20.0 μm, cracking may occur in the hard coat layer during a heat resistance test, or adhesion may be lowered, thereby causing delamination of the hard coat layer during a weather resistance test, which is not preferable.

It is preferable to manufacture a laminate such that properties of the hard coat layer and the intermediate layer exhibit the following numerical values:

a. a delta haze value of less than 2% in a Taber abrasion test at 1000 cycles based on ASTM D1044, b. an acceptance value of 97% or more in a tape adhesion test based on ASTM D3359, Method B, c. an acceptance value of 97% or more in a tape adhesion test based on ASTM D3359, Method B, d. an acceptance value of 97% or more in a tape adhesion test after immersion in water based on ASTM D870 using ion exchanged water kept at 65° C. for 3 days, and/or e. an acceptance value of 97% or more in a tape adhesion test after immersion in water based on ASTM D870 using ion exchanged water kept at 100° C. for 2 hours.

It is meant that the laminate has favorable adhesion when the area where the film has not delaminated is 97% or more in the above tests. In other words, when an area removed from the cross-cut area is less than 3%, it means favorable adhesion. Furthermore, it is preferable to manufacture a laminate such that the properties of the hard coat layer and the intermediate layer have acceptance values for automotive glazing requirements of Item 2 in ANSI Z26.1.

EXAMPLES

Hereinafter, the present invention will be specifically described by using Synthetic Examples, Examples, and Comparative Examples. However, the present invention is not limited to the following Examples.

Note that, in the following examples, "%" denotes "%, by mass", and "parts" denote "parts by mass". Additionally, the viscosity represents a value at 25° C. measured based on JIS Z 8803. The weight average molecular weight was measured by gel permeation chromatography (GPC) on the basis of polystyrene standards.

Note that while the following Examples, Comparative Examples, and Referential Examples exemplify examples in which a silicon oxide-based hard coat layer is laminated only on one side of a surface layer by the PE-CVD method, a structure having such a silicon oxide-based hard coat layer laminated on both surfaces is also preferably employed without any problem.

[Evaluation Method]

Various kinds of evaluations in Examples, Comparative Examples, and Referential Examples were performed according to the following methods:

<Measurement of Surface Roughness (Ra) Using Scanning Probe Microscope with Dynamic Force Mode (DFM)>

Surface roughness (Ra) and surface area ratio were determined by measuring using the SPI3800N scanning probe microscope manufactured by SII Nanotechnology Inc. (and distributed by Hitachi High-Tech Science Corp.) and the NSG10 silicon cantilever (equipped with a tip having a radius of curvature of about 10 nm) for the cantilever under conditions of a measuring range of 5 μm×5 μm in the vertical and horizontal directions, measuring 256×256 measurement points and a scanning frequency of 1 KHz followed by calculating the results with device internal software. Furthermore, measurements were carried out at 10 different locations followed by taking the average value thereof.

Here, surface roughness (average surface roughness, Ra) is a value obtained by averaging the absolute value of the difference of height from a reference surface to a designated surface (Z coordinate). Here, the reference surface is a surface containing the average value of the Z coordinates of all measurement points, while the designated surface is a surface that connects the Z coordinates of all measurement points (having for a unit surface thereof a triangle formed by connecting the closest 3 points).

<Water Contact Angle>

The water contact angle was measured by dropping a water droplet (about 0.03 mL) on the surface of the substrate and calculating the angle between the edge position and the top of the formed water droplet (Circular Arc Approximation Method).

<Appearance Evaluation>

The surface of the laminate having a silicon oxide layer obtained by PE-CVD was observed visually to confirm the presence or absence of cracks.

<Adhesion>

100 crosscuts were made at an interval of 1 mm with a cutter knife in the surface of the laminate having a silicon oxide layer obtained by PE-CVD followed by repeating three times a procedure consisting of adhering Nichiban adhesive tape ("Cellotape"™) thereto and forcibly delaminating the tape while pulling in the perpendicular direction and then evaluating adhesion in terms of the number of squares remaining on the substrate (in compliance with JIS K5400).

<Measurement of Total Light Transmittance and Haze Value>

Haze value was measured using the NDH2000 Haze Meter manufactured by Nippon Denshoku Industries Co., Ltd. Furthermore, haze value (H) is represented by H=Td/Ft×100 (Td: diffuse light transmittance, Tt: total light transmittance).

<Pencil Hardness>

The pencil hardness was measured by contacting a pencil with the surface of the substrate at an angle of 45° and pushing the pencil with the load of 750 grams. The hardness of the hardest pencil which did not scratch the surface of the substrate is the pencil hardness of the substrate (according to JIS-K5600).

<Abrasion Resistance>

The surface of the laminate having a silicon oxide layer obtained by PE-CVD was evaluated by abrading the surface of an abrading wheel using the CS-10F abrading wheel manufactured by Taber Industries Inc. for 25 revolutions with the ST-11 grindstone manufactured by Taber Industries Inc. prior to testing, followed by carrying out a Taber abrasion test for 1000 revolutions at a load of 500 g and measuring the change in haze value (ΔH) before and after the Taber abrasion test (in compliance with ASTM D1044).

Measurements were carried out on three test pieces having the same specifications, and the average value thereof was used as the performance value of the sample. Furthermore, the abrasion test was carried out after confirming that the abrading wheel used in the test demonstrated a change in haze value (ΔH) within the range of 0.6% to 1.0% in the case of having carried out the Taber abrasion test for 1000 revolutions by the same method on commercially available float glass (plate glass), and abrading wheels that were outside this range were not used in testing.

<Boiling Water Resistance>

A test piece of the laminate cut to a size of 60 mm×120 mm was immersed in boiling water at 100° C. followed by removing from the boiling water after holding therein for 2 hours, removing any adhered moisture, and allowing to stand in a room temperature environment for 2 hours followed by confirming any appearance change and testing adhesion of the surface of laminate having a silicon oxide layer obtained by PE-CVD.

Appearance was evaluated by confirming layer separation, formation of cracks, color tone and the presence or absence of changes in haze value.

Adhesion was evaluated by carrying out a crosscut tape test in compliance with JIS K5400, and after having formed 10×10 squares cut out at 1 mm intervals with a cutter knife in the form of a grid, tape having a prescribed adhesive force (such as Nichiban Cellophane Tape™) was affixed and adhered and then peeled off.

Furthermore, the appearance (status of layer delamination or lifting) immediately after carrying out testing (after having removed the test piece from boiling water, removed any adhered water, and allowed to stand for 2 hours in a room temperature environment) was designated as the "appearance", adhesion was designated as "adhesion", and the result obtained on the test piece which have been held at 110° C. for 100 hours and then placed under room atmosphere for 7 days after the passage of 7 days after carrying out the test was designated as the "elapsed result".

The adhesion was also confirmed on the interlayer delamination. The sample in which the intermediate layer and the hard coat layer was delaminated was referred to "Delamination A", and the sample in which the substrate and the intermediate layer was delaminated was referred to "Delamination B".

<Heat Resistance>

A test piece of the laminate cut to a size of 60 mm×120 mm was held in a constant temperature tank at 110° C. or 130° C. followed by evaluating appearance changes and adhesion of the laminate having a silicon oxide layer obtained by PE-CVD 1000 hours later.

Further, as in the boiling water resistance, the result obtained after the passage of 7 days after carrying out the test was designated as the "elapsed result".

<Accelerated Weather Resistance>

The accelerated weather resistance test was carried out by using super accelerated weather resistance machine (Metal Weather T, Daipla Wintes Co. Ltd.). 10, 20, 30 and 40 cycles of dew cycle weather resistance test was carried out in which one cycle was under the conditions of UV irradiation intensity of 900 W/m$^2$, black panel temperature of 63° C. for 4 hours, 1 minute of shower spray, 20° C. and 98 RH % for 4 hours, and 70° C. and 50 RH % for 4 hours. After these cycles, the samples were removed and scrubbed delicately by a sponge immersed in a neutral detergent to wash the surface of the laminates having silicon oxide layer obtained by PE-CVD process.

<Synthesis of Component (i)>

Synthesis Example 1

A 2-L flask equipped with a stirrer, condenser, dropping funnel and thermometer was charged with 33.7 g of diacetone alcohol, which was heated at 80° C. in a nitrogen stream. Portions of both the monomer mixture and the initiator solution which were previously prepared were successively fed to the flask for effecting reaction at 80° C. for 30 minutes, after which the remaining portions of both were added dropwise at 80-90° C. over 20 minutes. The contents were stirred at 80-90° C. for 5 hours, yielding a solution EX-i.

The monomer mixture of Synthesis Example 1 was prepared by mixing the following components:
  20 g of γ-methacryloxypropyltrimethoxysilane (trade name KBM-503 by Shin-Etsu Chemical Co., Ltd.) (corresponding to monomer unit A, and providing a monomer unit A proportion of 20% based on the resulting polymer),
  15 g of 2-[2'-hydroxy-5'-(2-methacryloxyethyl)phenyl]-2H-benzotriazole (trade name RUVA-93 by Otsuka Chemical Co., Ltd.) (corresponding to monomer unit B, and providing a monomer unit B proportion of 15% based on the resulting polymer),
  60 g of methyl methacrylate (MMA) and 5 g of glycidyl methacrylate (GMA) (corresponding to monomer unit C, and providing a monomer unit C proportion of 65% based on the resulting polymer), and
  140 g of diacetone alcohol.

In addition, the initiator solution of Synthesis Example 1 was prepared by mixing the following components:
  0.5 g of 2,2'-azobis(2-methylbutyronitrile), and
  40 g of diacetone alcohol.

Solution EX-i was a diacetone alcohol solution containing 40 wt % of polymer Component (i). The polymer solution had a viscosity of 5 Pa·s, and polymer Component (i) had Mw of 6×10$^4$.

Synthesis Example 2

A 2-L flask equipped with a stirrer, condenser, dropping funnel and thermometer was charged with 33.7 g of diacetone alcohol, which was heated at 80° C. in a nitrogen stream. Portions of both the monomer mixture and the initiator solution which were previously prepared were successively fed to the flask for effecting reaction at 80° C. for 30 minutes, after which the remaining portions of both were added dropwise at 80-90° C. over 20 minutes. The contents were stirred at 80-90° C. for 5 hours, yielding a solution EX-ii.

The monomer mixture of Synthesis Example 2 was prepared by mixing the following components:
  15 g of γ-methacryloxypropyltrimethoxysilane (trade name KBM-503 by Shin-Etsu Chemical Co., Ltd.) (corresponding to monomer unit A, and providing a monomer unit A proportion of 15% based on the resulting polymer),
  20 g of 2-[2'-hydroxy-5'-(2-methacryloxyethyl)phenyl]-2H-benzotriazole (trade name RUVA-93 by Otsuka Chemical Co., Ltd.) (corresponding to monomer unit B, and providing a monomer unit B proportion of 20% based on the resulting polymer),
  55 g of methyl methacrylate (MMA) and 10 g of glycidyl methacrylate (GMA) (corresponding to monomer unit C, and providing a monomer unit C proportion of 65% based on the resulting polymer), and
  140 g of diacetone alcohol.

In addition, the initiator solution of Synthesis Example 2 was prepared by mixing the following components:
  0.5 g of 2,2'-azobis(2-methylbutyronitrile), and
  40 g of diacetone alcohol Solution EX-ii was a diacetone alcohol solution containing 40 wt % of polymer Component (i). The polymer solution had a viscosity of 5 Pa·s, and polymer Component (i) had Mw of 6×10$^4$.

Synthesis Example 3 (Synthesis of Composite of Components (ii) and (iii))

A 1-L four-necked flask equipped with a stirrer, condenser, dropping funnel and thermometer was charged with a mixture of Component (ii) precursors and 10 g of an ion exchange resin (trade name Amberlite 200CT(H)-AG by Organo Corp.) as hydrolytic catalyst, and cooled to an internal temperature of 10° C. To the flask, an aqueous colloidal solution of Component (iii) was added dropwise from the dropping funnel over 1 hour.

With stirring, the flask contents were aged at 25° C. for 1 hour. Then 100 g of cyclopentanol was added to the flask, which was heated in an oil bath at 100° C. Concomitantly with heating, 115 g of a low boiling fraction was distilled off. At this point, the flask internal temperature was 87° C. The flask contents were filtered to remove the ion exchange resin. To the filtrate were added 200 g of diacetone alcohol, 300 g of cyclopentanol, 0.2 g of polyether-modified silicone oil (trade name KP-341 by Shin-Etsu Chemical Co., Ltd.) as leveling agent, and 0.7 g of tris(acetylacetonato)aluminum (III). The contents were further stirred at 25° C. for 1 hour, obtaining a solution EX-iii.

The following components were contained in the mixture of Component (ii) precursors:
  120 g of γ-acryloyloxypropyltrimethoxysilane (trade name KBM-5103 by Shin-Etsu Chemical Co., Ltd.), 30 g of γ-acryloyloxypropyl-methyldimethoxysilane (trade name KBM-5102 by Shin-Etsu Chemical Co., Ltd.), 150 g of tetraethoxysilane (trade name KBE-04 by Shin-Etsu Chemical Co., Ltd.)

In addition, the following components were contained in the aqueous colloidal solution of Component (iii):

30 g of core-shell type tetragonal titanium oxide solid-solution microparticles as Component (iii)

84 g of water and 180 g of ethanol.

In addition, the core-shell type tetragonal titanium oxide solid-solution microparticles as Component (iii) were dispersed so that they had a volume basis 50% cumulative distribution diameter (D50) of 20 nm, as measured by the dynamic light scattering method. The core-shell type microparticles each consist of a core of rutile type titanium oxide having 1 mol % manganese and 5 mol % tin and a shell of silicon oxide around the core. The cores and shells accounting for 75% and 25% based on the total weight of the core-shell type microparticles, respectively. Solution EX-iii was an alcohol solution containing 28 wt % of the cohydrolytic composite of Components (ii) and (iii), the alcohol comprises cyclopentanol, diacetone alcohol, ethanol and methanol. This solution had a viscosity of 10 mm$^2$/s, and Component (ii) had 2×10$^3$ of polystyrene-equivalent weight-average molecular weight, as determined by GPC analysis.

Synthesis Examples 4 to 6 (Synthesis of Composites of Component (ii), Component (iii) and Component (vii))

Each solution was obtained in a similar way to Synthesis Example 3, except on that each component of alkoxysilanes; solid contents in core-shell tin and manganese doped-titanium oxide dispersion; and solid contents in silicon dioxide dispersion (IPA-ST, Nissan Chemical Industry, Ltd.) were formulated as shown in Table 1. In addition, these solutions were diluted by diacetonealcoholand and cyclopentanol so that they can have the solid content of 28 wt %. Accordingly, 28 wt % co-hydrolyzed composite alcohol solutions EX-iv to EX-vi of Component (ii), Component (iii) and Component (vii) were obtained.

Synthesis Example 7 (Synthesis of Component (vi))

A two liter flask equipped with a stirrer, a condenser with a Dean-Stark trap, a dropping funnel and a thermometer was charged with 235 g (0.5 mol) of Methyl Silicate 51 (Colcoat Co., Ltd.), 0.1 g of TBT700 (Nippon Soda Co., Ltd.) and 0.6 g of di-tert-butylhydroxytoiuene, and heated to 85° C. To this was added 551 g (5 mol) of hydroxyethyl acrylate, effecting a reaction. Methanol (80 g) was observed to distill off. The reaction mixture was treated for 2 hours under heating and reduced pressure (100° C., 5 mmHg), giving 606 g (yield, 95%) of a colorless liquid siloxane acrylate EX-vii. The siloxane acrylate EX-vii had the viscosity of 73 mPa·s, the specific gravity of 1.223, the refractive index of 1.4630, and the number of acrylic functional groups included by design per molecule of 10 equivalents.

[Actinic Energy Radiation-Curable Acrylic Silicone Resin Composition and Preparation Method]

Preparation Example 1

In a brown plastic bottle, 250 weight parts of Solution EX1-i, 1715 weight parts of Solution EX1-iii, 50 parts of Akurit 8UA-347 (solid content 30 weight %, Taisei Fine Chemical Co., Ltd.), 400 weight parts of trimethylolpropane triacrylate (TMPT-A), and 100 weight parts of the siloxane acrylate EX-vii were metered. An amount of cyclopentanol was added so that the resulting composition can have a solid content of 40 wt %. The contents were mixed and agitated to obtain the actinic energy radiation-curable acrylic silicone resin composition ASC-1.

The formulation of the acrylic silicone resin composition was the following weight ratio of Components (i) to (vii):

Component (i) 100 parts by weight;
Component (ii) 450 parts by weight;
Component (iii) 30 parts by weight;
Component (iv) 15 parts by weight;
Component (v) 400 parts by weight;
Component (vi) 100 parts by weight;
Component (vii) 140 parts by weight.

Preparation Examples 2 to 4

The actinic energy radiation-curable acrylic silicone resin compositions ASC-2 to ASC-4 were obtained according to Example 1, so that the formulation ratio thereof were as shown in Examples 2 to 10 and Comparative Examples 1 to 5 of Table 2.

TABLE 1

| Solution | KBM-503 | RUVA-93 | MMA | GMA | KBE-04 | KBM-5103 | KBM-5102 | Coated TiO$_2$ | IPA-ST |
|---|---|---|---|---|---|---|---|---|---|
| EX-i | 20 | 15 | 60 | 5 | — | — | — | — | — |
| EX-ii | 15 | 20 | 55 | 10 | — | — | — | — | — |
| EX-iii | — | — | — | — | 150 | 120 | 30 | 30 | 0 |
| EX-iv | — | — | — | — | 300 | 100 | 50 | 30 | 140 |
| EX-v | — | — | — | — | 200 | 150 | 150 | 30 | 300 |
| EX-vi | — | — | — | — | 300 | 100 | 50 | 120 | 50 |

TABLE 2

Intermediate Layer Composition

| | Organic Component | | Inorganic Component | | | | | | |
|---|---|---|---|---|---|---|---|---|---|
| | Acrylic | Urethane | UVA copoly. Silicone Acrylate | | Specific Siloxane Acrylate | Alkoxysilane Hydrolytic Condensate + Inorganic Oxide + Coated TiO$_2$ | | | |
| Coating Compo. | Monomer TMPT-A | Acrylate 8US-347 | Sol. EX-i | Sol. EX-ii | Sol. EX-vii | Sol. EX-iii | Sol. EX-iv | Sol. EX-v | Sol. EX-vi |
| ASC-1 | 400 | 50 | 250 | — | 100 | — | 2214 | — | — |
| ASC-2 | 550 | 50 | — | 250 | 0 | 1178 | — | — | — |
| ASG-3 | 200 | 50 | — | 250 | 0 | — | — | 2607 | — |
| ASC-4 | 400 | 50 | 250 | — | 100 | — | — | — | 2214 |

TABLE 3

Intermediate Layer Composition

| | Organic Component | | | Inorganic Component | | | | |
|---|---|---|---|---|---|---|---|---|
| | Acrylic Monomer | Urethane Acrylate | UVA Copoly. Silicone Acrylate | Specific Siloxane Acrylate | Alkoxysilane Hydrolytic Condensate | Inorganic Oxide | Surface Coated TiO$_2$ | Inorganic Compo. Percent. |
| Coating Compo. | (v) | (iv) | (i) | (vi) | (ii) | (vii) | (iii) | X |
| ASC-1 | 400 | 15 | 100 | 100 | 450 | 140 | 30 | 0.58 |
| ASC-2 | 550 | 15 | 100 | 0 | 300 | 0 | 30 | 0.33 |
| ASC-3 | 200 | 15 | 100 | 0 | 400 | 300 | 30 | 0.70 |
| ASC-4 | 400 | 15 | 100 | 100 | 450 | 50 | 120 | 0.58 |

Preparation of Paint Composition for Adhesive Layer of Thermosetting Siloxane Resin Composition Reference Preparation Example 1

79.9 parts by weight of ethyl methacrylate ("EMA"), 33.6 parts by weight of cyclohexyl methacrylate ("CHMA"), 13.0 parts by weight of 2-hydroxyethyl methacrylate ("HEMA"), 126.6 parts by weight of methyl isobutyl ketone ("MIBK") and 63.3 parts by weight of 2-butanol ("2-BuOH") were added to and mixed in a flask equipped with a reflux condenser and stirrer in which the air had been replaced with nitrogen. After passing nitrogen gas through the mixture to remove the oxygen, the temperature was raised to 70° C. in the presence of a nitrogen gas flow followed by the addition of 0.33 parts by weight of azobisisobutyronitrile ("AIBN") and reacting in the presence of a nitrogen gas flow for 5 hours while stirring at 70° C. An additional 0.8 parts by weight of AIBN were added followed by raising the temperature to 80° C. and reacting for 3 hours to obtain an acrylic copolymer solution having a non-volatile content concentration of 39.6% by weight. The weight average molecular weight of the acrylic copolymer as measured by GPC (column: Shodex GPCA-804, eluent: chloroform) as polystyrene was 125,000.

Continuing, 43.2 parts by weight of MIBK, 21.6 parts by weight of 2-BuOH and 83.5 parts by weight of 1-methoxy-2-propanol were added to 100 parts by weight of the aforementioned acrylic copolymer solution and mixed followed by the addition of 5.3 parts by weight of Tinuvin 400 (triazine-based ultraviolet absorber, Ciba Specialty Chemicals Plc Ltd.) and 10.6 parts by weight of Vestanat B1358/100 (polyisocyanate compound precursor, Degussa Japan Co., Ltd.) at 1.0 equivalent of isocyanate groups to 1 equivalent of hydroxyl groups of the acrylic copolymer present in the acrylic resin solution, and further adding 0.15 parts by weight of dimethyl dineodecanoate tin (DMDNT) and stirring for 1 hour at 25° C. to prepare a paint composition P-1 for adhesive layer of thermosetting siloxane resin composition.

Preparation of Thermosetting Siloxane Resin Composition

Reference Preparation Example 2

80 parts by weight of a water-dispersible colloidal silica liquid dispersion (Cataloid SN-30, particle diameter about 17 nm, solid content concentration: 30% by weight, manufactured by Catalysts and Chemicals Industry Co., Ltd.) was added to 127 parts by weight of methyltrimethoxysilane while cooling in an ice bath. After stirring this mixture for 90 minutes at 25° C., the reaction liquid stirred for 4 hours at 60° C. was cooled with ice water after which 24 parts by weight of acetic acid and 2 parts by weight of a curing catalyst in the form of sodium acetate were mixed therein while cooling with ice water to obtain a thermosetting siloxane resin composition T-1.

Example 1

A polycarbonate resin (Panlite L1250Z, Teijin Ltd.) was charged into an injection press molding device to obtain a transparent polycarbonate resin sheet having a thickness of 4 mm and measuring 550 mm on a side.

Both sides of the polycarbonate resin sheet serving as a substrate were dip-coated with the actinic energy radiation-curable acrylic silicone resin composition ASC-1 and dried followed by irradiating both sides with ultraviolet light at 1000 mJ/cm$^2$ with a high-pressure mercury lamp to form an intermediate layer having a film thickness of about 15 µm on both sides of the polycarbonate substrate.

Figure 2:
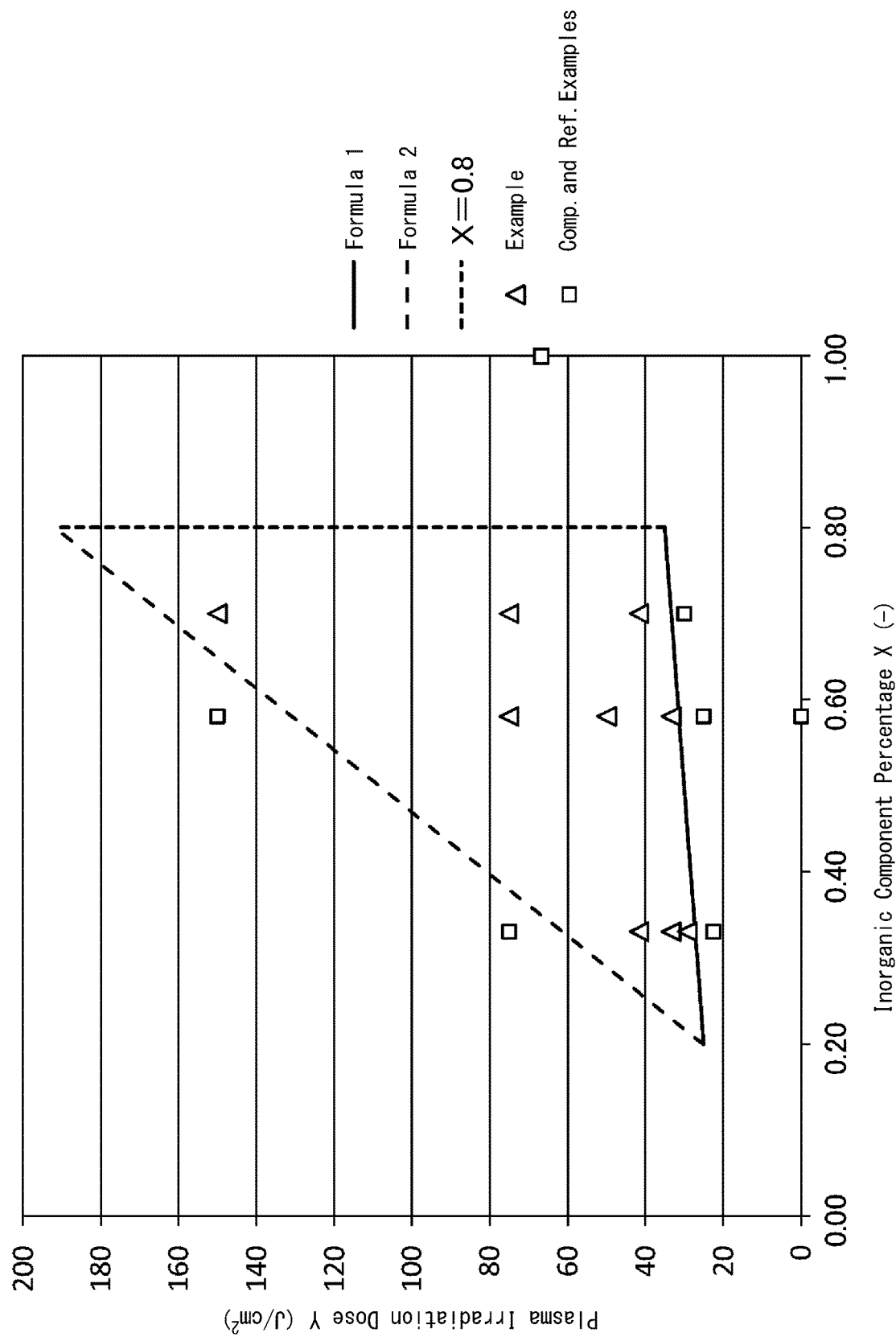
FIG. 2 is a partially enlarged view of FIG. 1.
Figure 3:
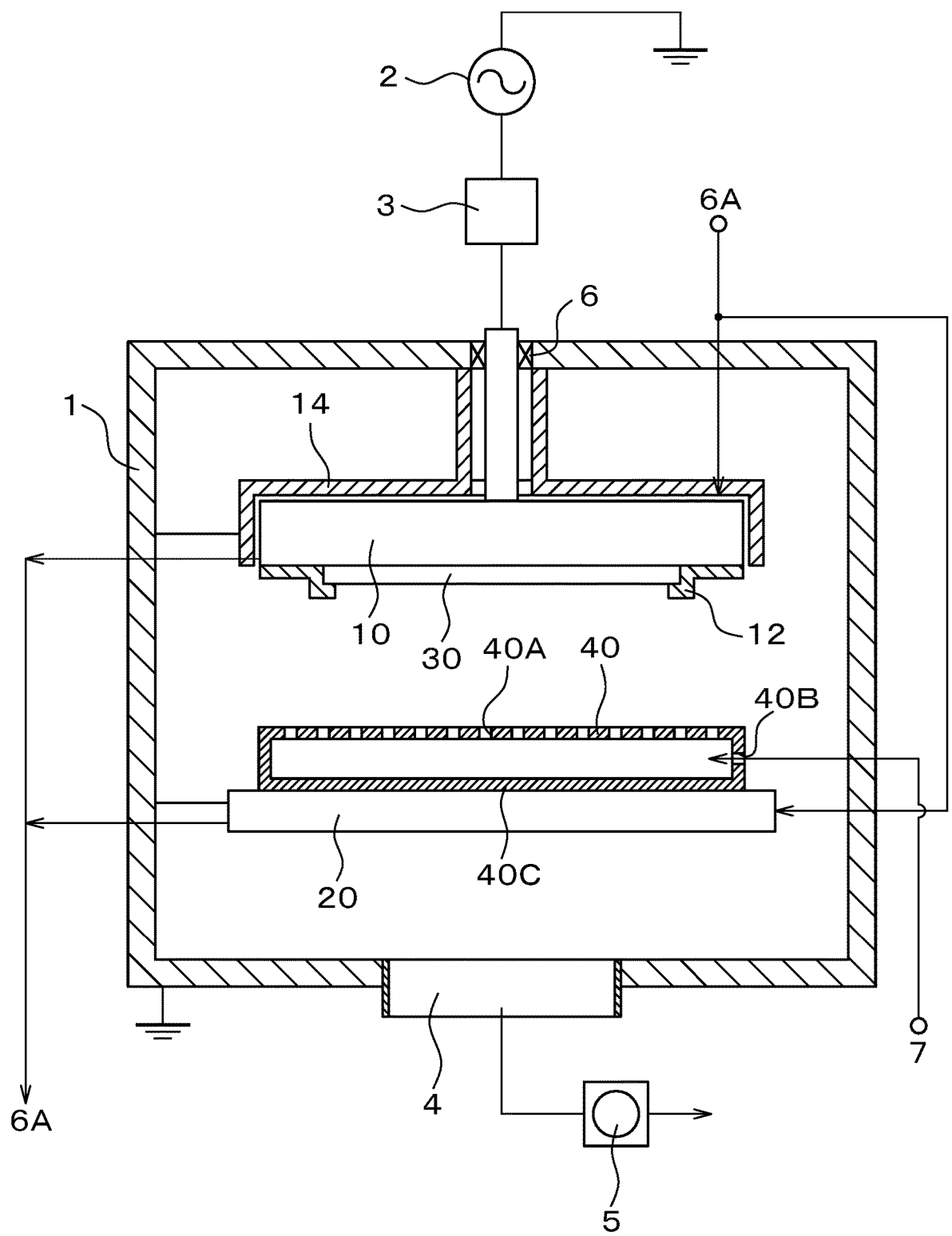
FIG. 3 is a schematic diagram of an example of a capacitively coupled type PE-CVD apparatus usable to form a silicon oxide-based hard coat layer by a PE-CVD method according to the present invention.
Figure 4:
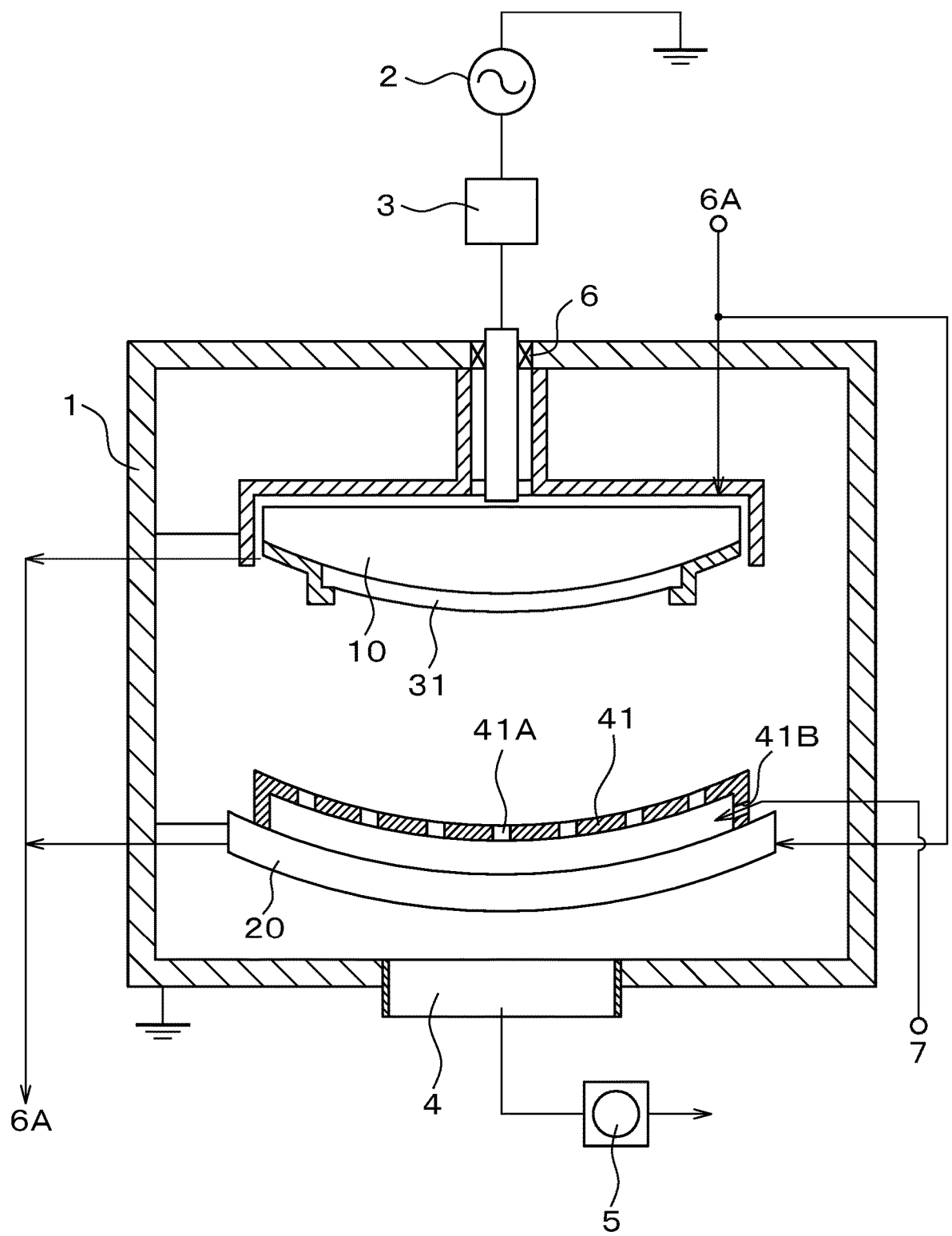
FIG. 4 is a schematic diagram of another example of the capacitively coupled type PE-CVD apparatus usable to form a silicon oxide-based hard coat layer by the PE-CVD method according to the present invention.
Figure 5:
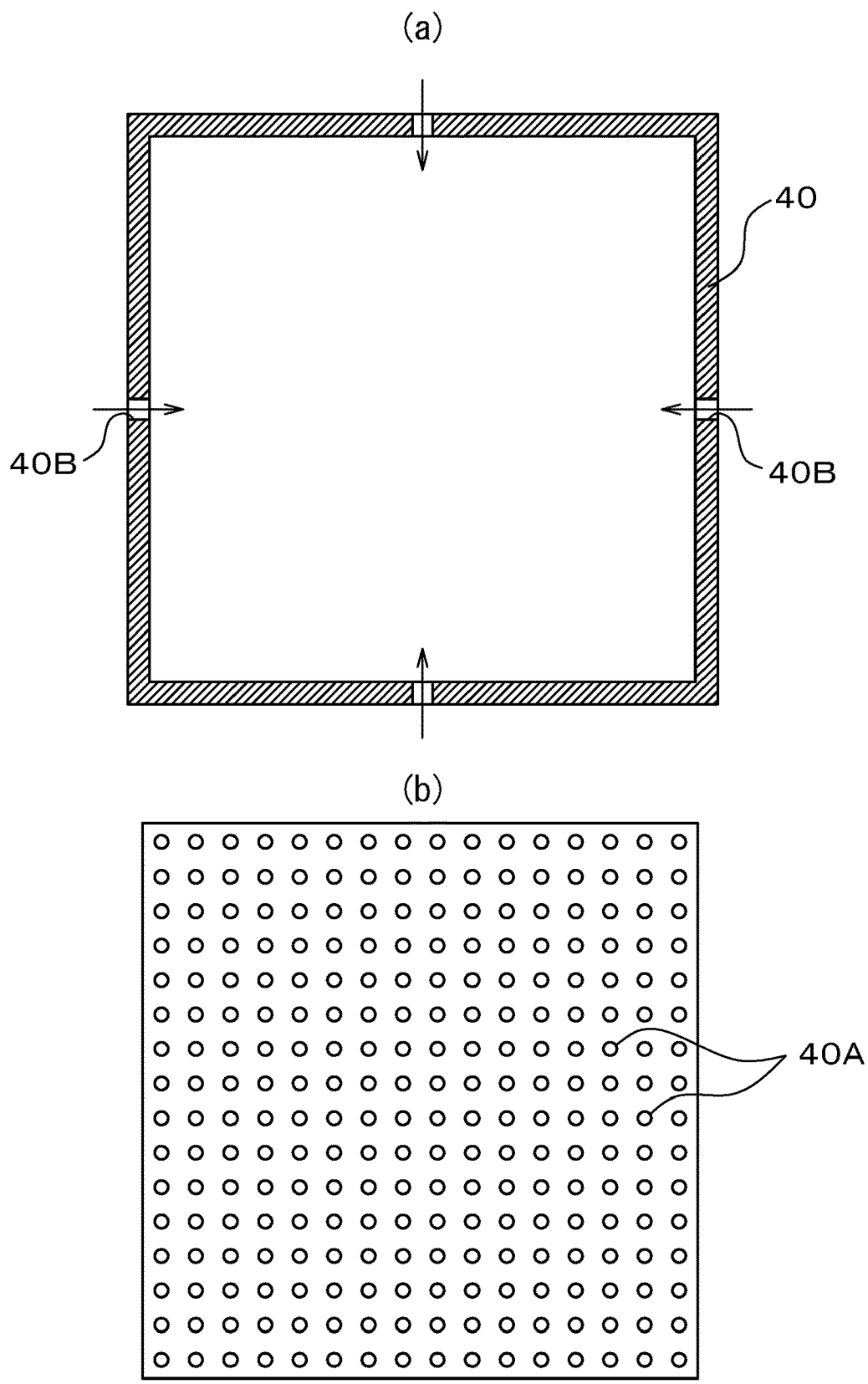

The polycarbonate resin substrate of 60 cm×60 cm size having a cured underlayer formed on both sides thereof was placed in the capacitive coupling type of PE-CVD device shown in FIG. 2 on the side of the parallel plate electrode to which high-frequency electrical power is applied by tightly pressing against the electrode so that there were no gaps between the substrate and the electrode surface followed by drawing a vacuum for 1 hour. The ultimate vacuum pressure was 0.03 Pa.

Next, argon gas (purity: 99.9% or more) was introduced into the system at 1200 sccm through a line equipped with a mass flow controller followed by applying high-frequency electrical power of 13.56 MHz and 1.0 KW between parallel plate electrodes having cooling lines to generate plasma between the parallel plate electrodes. High-frequency electrical power was applied for a total of 3 minutes while in this state to carry out plasma treatment on one side of the cured underlayer.

Following the aforementioned plasma treatment, the introduction of argon gas was discontinued and a step was carried out for forming a silicon oxide layer by PE-CVD.

More specifically, 1,3,5,7-tetramethylcyclotetrasiloxane (purity: 99.99% or more, abbreviated as "D4H") at 10 sccm and oxygen (purity: 99.9% or more) at 300 sccm were introduced into the system through separate lines equipped with mass flow controllers followed by the application of high-frequency electrical power of 13.56 MHz and 1.5 KW between parallel plate electrodes through a matching box to generate plasma in the space between the parallel plate electrodes.

After applying high-frequency electrical power of 1.5 KW for 60 seconds at a D4H flow rate of 10 sccm and oxygen flow rate of 300 sccm, the flow rate of the D4H was continuously increased to 95 sccm for 40 seconds (with "continuously" referring to increasing at a constant rate per unit time) after which high-frequency electrical power was continuously decreased to 1.0 KW.

Here, the average deposition rate until 30 seconds after the start of formation of the silicon oxide layer by PE-CVD was 0.8 nm/sec.

After applying high-frequency electrical power of 1.0 KW for a total of 720 seconds at a D4H flow rate of 95 sccm and oxygen flow rate of 1350 sccm, the D4H flow rate continuously decreased to 0 sccm over the course of 30 seconds while holding the high-frequency electrical power at 1.0 KW followed by discontinuing the application of high-frequency electrical power. Furthermore, the oxygen flow rate was fixed at 1350 sccm until the application of high-frequency electrical power was discontinued.

Thus, the target laminate was obtained by cooling a substrate for 5 minutes on parallel plate electrodes following completion of the formation of a silicon oxide layer thereon by PE-CVD, returning the atmosphere inside the device to atmospheric pressure and removing the substrate from the device.

Furthermore, the film thickness of the silicon oxide layer obtained by PE-CVD was about 6.6 µm. In addition, the maximum temperature of the substrate surface on the side laminated with the silicon oxide layer by PE-CVD was about 110° C. throughout the plasma treatment step and silicon oxide layer lamination step by PE-CVD.

The results of evaluating the performance of the laminate along with the physical properties of each layer are shown in Table 5.

The results of evaluating the performance of the laminate obtained in each of the examples in the same manner as Example 1 along with the physical properties of each layer are also shown in Table 5. Furthermore, the physical property values of the intermediate layer shown in the table are the physical property values at the stage immediately prior to deposition and formation of the silicon oxide layer by PE-CVD after having carried out plasma treatment on that same layer.

Examples 2 to 10 and Comparative Examples 1 to 5

The laminates were obtained in the same manner as Example 1 with the exception of coating with resin compositions shown in Table 4 and carrying out the plasma irradiation treatment under the condition of Table 4.

The results are shown in Table 5.

Comparative Example 6

The polycarbonate resin laminate was obtained in the same manner as Example 1 with the exception of not subjecting the surface of the cured underlayer to a plasma irradiation treatment to activate thereof before forming a PE-CVD film formation.

The results of the obtained laminates are shown in Table 5.

Reference Example X

A polycarbonate resin (Panlite L1250Z, Teijin Ltd.) was charged into an injection press molding device to obtain a transparent polycarbonate resin sheet having a thickness of 4 mm and measuring 550 mm on a side.

Both sides of the polycarbonate resin sheet serving as a substrate were dip-coated with the precursor material liquid (P-1) and dried followed by thermosetting at 120° C. for 1 hour to form the adhesive layer having a film thickness of about 8 µm on both sides of the polycarbonate substrate.

Further, the sample was dip-coated with the precursor material liquid (T-1) for the cured underlayer and dried followed by thermosetting at 120° C. for 1 hour to form the cured underlayer having a film thickness of about 4 µm on both sides of the polycarbonate substrate.

Then, the laminate was formed by subjecting to the plasma treatment and CVD film formation under the conditions shown in Table 4.

If the intermediate layer was formed of a thermosetting siloxane resin composition, the plasma treatment with intense energy is necessary for activating the surface of the intermediate layer, in order to obtain good weather resistance and scratch resistance.

Reference Example Y

The laminate was formed in the same manner as Reference Example X with the exception that the plasma treatment was carried out under the conditions of Table 4.

If the intermediate layer was formed of a thermosetting siloxane resin composition and the plasma treatment was carried out with as weak as the energy used in the intermediate layer for the present invention formed of acrylic silicone resin composition, good adhesive, heat resistance and scratch resistance could not be obtained.

The results are shown in Table 5.

TABLE 4

| | Coating Compo. | Inorganic Compo. Percent. X [—] | Thick. Interm. Layer [μm] | Surface Treatment Conditions of Plasma Irradiation for Intermediate Layer | | | | Surface State of Interm. Layer After Plasma Irrad. | |
|---|---|---|---|---|---|---|---|---|---|
| | | | | Input Power [W] | Intens. [W/cm²] | Irrad. Time [min.] | Irrad. Energy Y [J/cm²] | Surface Rough. Ra [nm] | Water Contact Angle [°] |
| Ex. 1 | ASC-1 | 0.58 | 15 | 1000 | 0.278 | 3 | 50 | 1.5 | 30 |
| Ex. 2 | ASC-2 | 0.33 | 15 | 1000 | 0.278 | 2 | 33 | 2.7 | 30 |
| Ex. 3 | ASC-3 | 0.70 | 15 | 1000 | 0.278 | 4.5 | 75 | 1.6 | 26 |
| Ex. 4 | ASC-1 | 0.58 | 15 | 1000 | 0.278 | 4.5 | 75 | 1.9 | 22 |
| Ex. 5 | ASC-2 | 0.33 | 15 | 1000 | 0.278 | 2.5 | 42 | 4.2 | 20 |
| Ex. 6 | ASC-3 | 0.70 | 15 | 1000 | 0.278 | 9 | 150 | 2.4 | 7 |
| Ex. 7 | ASC-1 | 0.58 | 15 | 500 | 0.139 | 4 | 33 | 1.2 | 34 |
| Ex. 8 | ASC-2 | 0.33 | 15 | 500 | 0.139 | 3.5 | 29 | 2.1 | 33 |
| Ex. 9 | ASC-3 | 0.70 | 15 | 500 | 0.139 | 5 | 42 | 1.0 | 35 |
| Ex. 10 | ASC-4 | 0.58 | 12 | 1000 | 0.278 | 4.5 | 75 | 1.5 | 30 |
| Comp. Ex. 1 | ASC-1 | 0.58 | 15 | 1000 | 0.278 | 9 | 150 | 7.2 | 25 |
| Comp. Ex. 2 | ASC-2 | 0.33 | 15 | 1000 | 0.278 | 4.5 | 75 | 14.4 | 35 |
| Comp. Ex. 3 | ASC-1 | 0.58 | 15 | 500 | 0.139 | 3 | 25 | 1.2 | 55 |
| Comp. Ex. 4 | ASC-2 | 0.33 | 15 | 450 | 0.125 | 3 | 23 | 1.6 | 55 |
| Comp. Ex. 5 | ASC-3 | 0.70 | 15 | 600 | 0.167 | 3 | 30 | 0.8 | 50 |
| Comp. Ex. 6 | ASC-1 | 0.58 | 15 | — | — | — | 0 | 0.5 | 82 |
| Ref. Ex. X | Thermoset. Siloxane Resin | 1.00 | — | 3000 | 0.833 | 20 | 1000 | 5.6 | 10 |
| Ref. Ex. Y | Thermoset. Siloxane Resin | 1.00 | — | 1000 | 0.278 | 4 | 67 | 0.9 | 40 |

TABLE 5

| | Film Formation Samples After Formation of Hard Coat Layer | | | | | | | | | | | | |
|---|---|---|---|---|---|---|---|---|---|---|---|---|---|
| | Taber Test | | | | Adhesive | | Heat Resistance | | Accelerated Weather Resistance | | | | |
| | | After | | | | After | | | | | | | |
| | TT [%] | Haze [%] | 1000 rot. ΔH [%] | Pen. Hard. | Initial | Boil. Water | Elapsed | 110° C. 1000 hr | 130° C. 1000 hr | 10 cycle | 20 cycle | 30 cycle | 40 cycle |
| Ex. 1 | 91.2 | 0.6 | 0.7 | 4H | G | G | G | G | G | G | G | G | Crack |
| Ex. 2 | 91.2 | 0.7 | 0.7 | 4H | G | G | G | G | G | G | G | Del. A | — |
| Ex. 3 | 91.1 | 0.6 | 0.6 | 4H | G | G | G | G | G | G | G | G | Del. B |
| Ex. 4 | 91 1 | 0.8 | 0.7 | 4H | G | G | G | G | G | G | G | G | Crack |
| Ex. 5 | 91.0 | 0.9 | 0.7 | 4H | G | G | G | G | G | G | G | Del. A | — |
| Ex. 6 | 91.1 | 0.8 | 0.7 | 4H | G | G | G | G | G | G | G | G | Del. A |
| Ex. 7 | 91.1 | 0.5 | 0.7 | 4H | G | G | G | G | G | G | G | G | Crack, Del. A |
| Ex. 8 | 91.1 | 0.6 | 0.7 | 4H | G | G | G | G | G | G | G | G | crack, Del. A |
| Ex. 9 | 91.1 | 0.6 | 0.7 | 4H | G | G | G | G | G | G | G | G | Del. A |
| Ex. 10 | 90.8 | 0.8 | 0.9 | 4H | G | G | G | G | G | G | G | G | G |
| Comp. Ex. 1 | 91.1 | 1.4 | 0.8 | 4H | G | Del. A | — | G | G | Del. A | — | — | — |
| Comp. Ex. 2 | 89.9 | 7.6 | — | — | Del. A | — | — | Crack | Crack | Del. A | — | — | — |

TABLE 5-continued

Film Formation Samples After Formation of Hard Coat Layer

| | | | Taber Test After | | Adhesive | | | Heat Resistance | | Accelerated Weather Resistance | | | |
|---|---|---|---|---|---|---|---|---|---|---|---|---|---|
| | TT [%] | Haze [%] | 1000 rot. ΔH [%] | Pen. Hard. | Initial | Boil. Water | Elapsed | 110° C. 1000 hr | 130° C. 1000 hr | 10 cycle | 20 cycle | 30 cycle | 40 cycle |
| Comp. Ex. 3 | 91.1 | 0.5 | 0.7 | 4H | Del. A | — | — | G | Del. A | Del. A | — | — | — |
| Comp. Ex. 4 | 91.2 | 0.6 | 0.8 | 4H | G | Del. A | — | Del. A | Del. A | Del. A | — | — | — |
| Comp. Ex. 5 | 91.1 | 0.5 | 0.7 | 4H | Del. A | — | — | G | G | Del. A | — | — | — |
| Comp. Ex. 6 | 91.1 | 0.7 | 0.7 | 4H | Del. A | — | — | Del. A | Del. A | Del. A | — | — | — |
| Ref. Ex. X | 91.1 | 0.6 | 0.7 | H | G | G | G | G | G | G | G | G | G |
| Ref. Ex. Y | 91.1 | 0.4 | 0.7 | H | G | G | Del. A | G | Crack | G | G | Del. A | — |

G: good;
Del. A: Delamination of coating layer between HC/CVD interlayer;
Del. B: Delamination of coating layer between PC/HC interlayer The laminate obtained by the present invention has superior surface scratch resistance comparable to that of inorganic glass and is also provided with a high level of environmental resistance enabling it to be used for long periods of time even in harsh usage environments, and can be used in, for example, automobile window materials, construction members and surface protective plates of solar batteries, thereby making it extremely useful.

BRIEF DESCRIPTION OF THE REFERENCE SYMBOLS

1 Vacuum vessel
2 Power supply
3 Matching box
4 Exhaust port
5 Vacuum pump
6A Cooling medium
7 Reaction gas
10 Cathode electrode
14 Shielding component
20 Anode electrode
30,31 Treated substrates
40,41 Gas introducing head
40A,41A Blowout holes
40B,41B Inlets

The invention claimed is:
1. A method for manufacturing a laminate, comprising:
(1) curing an acrylic silicone resin composition by an active energy ray on an organic resin substrate to form an intermediate layer, wherein the acrylic silicone resin composition is an acrylic silicone resin composition containing, with respect to 100 parts by mass of the following Component (i), from 100 to 500 parts by mass of the following Component (ii), from 10 to 150 parts by mass of the following Component (iii), from 5 to 50 parts by mass of the following Component (iv), from 200 to 1000 parts by mass of the following Component (v), from 0 to 500 parts by mass of the following Component (vi), and from 0 to 500 parts by mass of the following Component (vii), and an inorganic component percentage X value obtained by dividing total parts by mass of the following Components (ii), (iii), (vi), and (vii) by total parts by mass of the following Components (i) to (vii) is from 0.2 to 0.8;
(2) dry etching a surface of the intermediate layer obtained in step (1) with a non-oxidizing gas plasma so as to satisfy the following Formulae 1 and 2:

$$Y > 5/3 \times (10 \times X + 13) \quad \text{Formula 1:}$$

$$Y < 275 \times X - 30, \quad \text{Formula 2:}$$

wherein Y represents a plasma irradiation dose (J/cm²); then
(3) plasma polymerizing an organosilicon compound on the surface of the intermediate layer obtained in step (2) to form a hard coat layer:
Component (i): a vinyl-based polymer represented by the following general formula (I):

$$\text{Poly-}[(A)_a\text{-co-}(B)_b\text{-co-}(C)_c] \quad \text{(I)}$$

wherein
'A', 'B', and 'C' each independently represent a vinyl-based monomer unit;
square brackets and -co- represent being a random copolymer;
'a', 'b', and 'c' represent a mole fraction;
'A' represents a vinyl-based monomer unit having an alkoxysilyl group, and 'a' represents a mole fraction of the monomer unit A and accounts for from 1 to 50% by mass of a total amount of the vinyl-based polymer;
'B' represents a ultraviolet-absorbing vinyl-based monomer unit, and 'b' represents a mole fraction of the monomer unit B and accounts for from 5 to 40% by mass of the total amount of the vinyl-based polymer; and
'C' represents another monomer unit copolymerizable with the vinyl-based monomer units A and B, and 'c' represents a mole fraction of the monomer unit C and accounts for [100−(content of monomer unit A)−(content of monomer unit B)]% by mass of the total amount of the vinyl-based polymer);
Component (ii): a hydrolytic condensate obtained by (co-)hydrolysis and condensation of at least one selected from alkoxysilanes represented by the following general formula (II) and partial hydrolysates thereof:

$$R^1_m R^2_n Si(OR^3)_{4-m-n} \quad \text{(II)}$$

wherein

R$^1$ and R$^2$ each independently represent a hydrogen atom or a monovalent hydrocarbon group having 1 to 20 carbon atoms which may be unsubstituted or may have a vinylic polymerizable group, the substituents optionally bonding to each other;

R$^3$ represents an alkyl group having 1 to 3 carbon atoms; and

'm' and 'n' each independently represent 0 or 1, and 'm+n' represent 0, 1, or 2;

Component (iii): core-shell type tetragonal titanium oxide solid-solution fine particles having a core of tetragonal titanium oxide fine particles containing tin and manganese in the form of solid solution and a shell of silicon oxide outside the core, wherein, as measured by a dynamic light scattering method, the core fine particles have a 50% cumulative distribution diameter of 30 nm or less on a volumetric basis, the core-shell type tetragonal titanium oxide solid-solution have a 50% cumulative distribution diameter of 50 nm or less on a volumetric basis, the solid solution content of tin expressed by a mole ratio of titanium to tin (Ti/Sn) is from 10 to 1,000, and the solid solution content of manganese expressed by a mole ratio of titanium to manganese (Ti/Mn) is 10 to 1,000;

Component (iv): a polycarbonate-based and/or polyester-based urethane-modified vinyl-based polymer, provided that Component (iv) is not Component (i);

Component (v): a vinyl-based polymerizable monomer that has no alkoxysilyl group and that does not form any polymer and/or any condensate before irradiation by the active energy ray, provided that Component (v) is not Components (i) and (ii);

Component (vi): a siloxane acrylate represented by the following general formula (IIIa):

[Chem. 1]

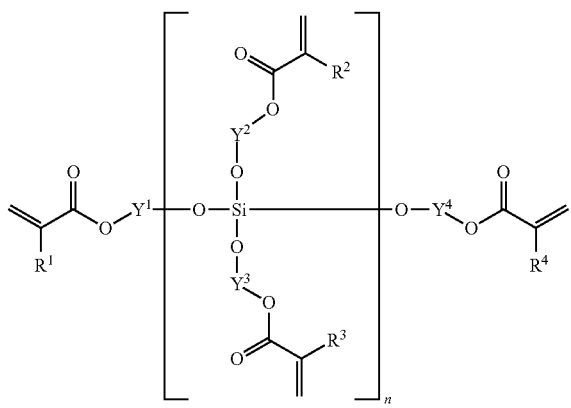

(IIIa)

wherein

R$^1$, R$^2$, R$^3$, and R$^4$ each independently represent a hydrogen atom or a methyl group;

Y$^1$, Y$^2$, Y$^3$ and Y$^4$ each independently represent an alkylene group having 1 to 10 carbon atoms; and 'n' represents an integer of from 1 to 10; and Component (vii): an inorganic oxide, provided that Component (vii) is not Component (iii).

2. The method according to claim 1, wherein Component (vi) is contained in an amount of from 20 to 500 parts by mass with respect to 100 parts by mass of Component (i).

3. The method according to claim 1, wherein the organosilicon compound is plasma polymerized by using a capacitively coupled plasma generator.

4. The method according to claim 1, wherein the organic resin substrate is composed of a single layer.

5. The method according to claim 1, wherein the organic resin substrate has a plurality of layers including a base resin and a cap layer that are co-extruded or laminated together.

6. The method according to claim 1, wherein the hard coat layer has a thickness of from 3.5 to 20.0 μm.

7. The method according to claim 1, wherein, by the dry etching at the step (2), the surface of the intermediate layer has a water contact angle of 40° or less and a surface roughness of from 0.7 to 5 nm.

8. The method according to claim 1, wherein the laminate has an acceptance value of 97% or higher in a tape adhesion test based on ASTM D3359, Method B and a tape adhesion test according to ASTM D870 using ion exchanged water kept at 65° C. for 3 days, and has a delta haze value of less than 2% in a Taber abrasion test at 1000 cycles based on ASTM D1044.

9. The method according to claim 1, wherein a composition of the hard coat layer is changed continuously from an interface with the intermediate layer to the surface of the hard coat layer in a thickness direction by continuously changing electric power to be input, an amount of an organosilicon gas to be introduced, and an amount of a carrier gas to be introduced during the plasma irradiation.

10. The method according to claim 1, wherein the organosilicon compound used for the plasma polymerization has an average composition represented by the following Formula (A):

$$(SiH_xO_yR_z)_n \quad \text{Formula (A):}$$

wherein

R represents a hydrocarbon group having 1 to 8 carbon atoms, an alkoxy group having 1 to 4 carbon atoms, a carboxy group having 1 to 4 carbon atoms, an amino group, a methylamino group, a dimethylamino group, or a hydroxy group;

'x' represents from 0.5 to 2;

'y' represents from 0.1 to 1;

'z' represents from 0.5 to 1.5; and

'n' represents from 1 to 6.

11. The method according to claim 1, wherein the acrylic silicone resin composition used for forming the intermediate layer contains an organic ultraviolet absorber and/or an organic ultraviolet stabilizer.

12. The method according to claim 1, wherein the organic resin substrate is a polycarbonate resin substrate.

* * * * *